US008866196B2

(12) United States Patent
Alexopoulos

(10) Patent No.: US 8,866,196 B2
(45) Date of Patent: Oct. 21, 2014

(54) PROGRAMMABLE SUBSTRATE AND APPLICATIONS THEREOF

(75) Inventor: Nicolaos G. Alexopoulos, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/600,087

(22) Filed: Aug. 30, 2012

(65) Prior Publication Data

US 2013/0248936 A1 Sep. 26, 2013

Related U.S. Application Data

(60) Provisional application No. 61/614,066, filed on Mar. 22, 2012.

(51) Int. Cl.
*H01L 27/10* (2006.01)

(52) U.S. Cl.
USPC .......................................................... 257/204

(58) Field of Classification Search
USPC ............ 257/202, 204, E27.07, E27.111, 414; 381/175, 176, 399; 438/53, 652; 336/200, 223
See application file for complete search history.

(56) References Cited

U.S. PATENT DOCUMENTS

2013/0248936 A1* 9/2013 Alexopoulos ................ 257/204

* cited by examiner

*Primary Examiner* — Whitney T Moore
(74) *Attorney, Agent, or Firm* — Garlick & Markison; Bruce E. Garlick

(57) ABSTRACT

An integrated circuit die includes a semiconductor substrate and a plurality of electronic circuits on the semiconductor substrate. The semiconductor substrate is divided into a plurality of regions. A first region of the substrate supports a first type of electronic circuit and has first permittivity, permeability, and conductivity characteristics. A second region of the substrate supports a second type of electronic circuit and has second permittivity, permeability, and conductivity characteristics.

20 Claims, 23 Drawing Sheets portable computing communication device 10, 12 side view programmable FSS side view side view side view top view top view side view side view side view

PROGRAMMABLE SUBSTRATE AND APPLICATIONS THEREOF

CROSS REFERENCE TO RELATED PATENTS

This patent application is claiming priority under 35 USC §119(e) to a provisionally filed patent application entitled PROGRAMMABLE SUBSTRATE AND PROJECTED ARTIFICIAL MAGNETIC CONDUCTOR, having a provisional filing date of Mar. 22, 2012, and a provisional Ser. No. 61/614,066, which is incorporated by reference herein.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to electromagnetism and more particularly to electromagnetic circuitry.

2. Description of Related Art

Artificial magnetic conductors (AMC) are known to suppress surface wave currents over a set of frequencies at the surface of the AMC. As such, an AMC may be used as a ground plane for an antenna or as a frequency selective surface band gap.

An AMC may be implemented by metal squares of a given size and at a given spacing on a layer of a substrate. A ground plane is on another layer of the substrate. Each of the metal squares is coupled to the ground plane such that, a combination of the metal squares, the connections, the ground plane, and the substrate, produces a resistor-inductor-capacitor (RLC) circuit that produces the AMC on the same layer as the metal squares within a set of frequencies.

As is also known, integrated circuit (IC) substrates consist of a pure compound (e.g., silicon, germanium, gallium arsenide, etc.) to produce a semiconductor. The conductivity of the substrate may be changed by adding an impurity (i.e., a dopant) to the pure compound. For a crystalline silicon substrate, a dopant of boron or phosphorus may be added to change the conductivity of the substrate.

BRIEF DESCRIPTION OF THE SEVERAL VIEWS OF THE DRAWING(S)

DETAILED DESCRIPTION OF THE INVENTION

Figure 1:
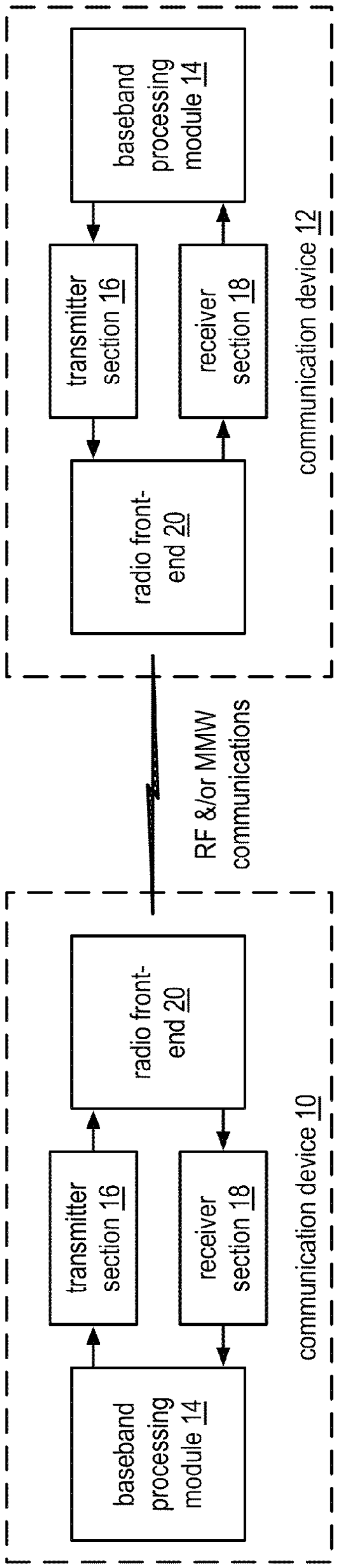
FIG. 1 is a schematic block diagram of an embodiment of communication devices in accordance with the present invention.

FIG. 1 is a schematic block diagram of an embodiment of communication devices 10, 12 communicating via radio frequency (RF) and/or millimeter wave (MMW) communication mediums. Each of the communication devices 10 12 includes a baseband processing module 14, a transmitter section 16, a receiver section 18, and a radio front-end circuit 20. The radio front-end circuit 20 will be described in greater detail with reference to one or more of FIGS. 2-35. Note that a communication device 10, 12 may be a cellular telephone, a wireless local area network (WLAN) client, a WLAN access point, a computer, a video game console and/or player unit, etc.

In an example of operation, one of the communication devices 10 12 has data (e.g., voice, text, audio, video, graphics, etc.) to transmit to the other communication device. In this instance, the baseband processing module 14 receives the data (e.g., outbound data) and converts it into one or more outbound symbol streams in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion includes one or more of: scrambling, puncturing, encoding, interleaving, constellation mapping, modulation, frequency spreading, frequency hopping, beamforming, space-time-block encoding, space-frequency-block encoding, frequency to time domain conversion, and/or digital baseband to intermediate frequency conversion. Note that the baseband processing module converts the outbound data into a single outbound symbol stream for Single Input Single Output (SISO) communications and/or for Multiple Input Single Output (MISO) communications and converts the outbound data into multiple outbound symbol streams for Single Input Multiple Output (SIMO) and Multiple Input Multiple Output (MIMO) communications.

The transmitter section 16 converts the one or more outbound symbol streams into one or more outbound RF signals that has a carrier frequency within a given frequency band (e.g., 2.4 GHz, 5 GHz, 57-66 GHz, etc.). In an embodiment, this may be done by mixing the one or more outbound symbol streams with a local oscillation to produce one or more up-converted signals. One or more power amplifiers and/or power amplifier drivers, which may be in the front-end circuit and/or in the transmitter section, amplifies the one or more up-converted signals, which may be RF bandpass filtered, to produce the one or more outbound RF signals. In another embodiment, the transmitter section 16 includes an oscillator that produces an oscillation. The outbound symbol stream(s) provides phase information (e.g., $+/-\Delta\theta$ [phase shift] and/or $\theta(t)$ [phase modulation]) that adjusts the phase of the oscillation to produce a phase adjusted RF signal(s), which is transmitted as the outbound RF signal(s). In another embodiment, the outbound symbol stream(s) includes amplitude information (e.g., $A(t)$ [amplitude modulation]), which is used to adjust the amplitude of the phase adjusted RF signal(s) to produce the outbound RF signal(s).

In yet another embodiment, the transmitter section 14 includes an oscillator that produces an oscillation(s). The outbound symbol stream(s) provides frequency information (e.g., $+/-\Delta f$ [frequency shift] and/or $f(t)$ [frequency modulation]) that adjusts the frequency of the oscillation to produce a frequency adjusted RF signal(s), which is transmitted as the outbound RF signal(s). In another embodiment, the outbound symbol stream(s) includes amplitude information, which is used to adjust the amplitude of the frequency adjusted RF signal(s) to produce the outbound RF signal(s). In a further embodiment, the transmitter section includes an oscillator that produces an oscillation(s). The outbound symbol stream(s) provides amplitude information (e.g., $+/-\Delta A$ [amplitude shift] and/or $A(t)$ [amplitude modulation) that adjusts the amplitude of the oscillation(s) to produce the outbound RF signal(s).

The radio front-end circuit 20 receives the one or more outbound RF signals and transmits it/them. The radio front-end circuit 20 of the other communication devices receives the one or more RF signals and provides it/them to the receiver section 18.

The receiver section 18 amplifies the one or more inbound RF signals to produce one or more amplified inbound RF signals. The receiver section 18 may then mix in-phase (I) and quadrature (Q) components of the amplified inbound RF signal(s) with in-phase and quadrature components of a local oscillation(s) to produce one or more sets of a mixed I signal and a mixed Q signal. Each of the mixed I and Q signals are combined to produce one or more inbound symbol streams. In this embodiment, each of the one or more inbound symbol streams may include phase information (e.g., $+/-\Delta\theta$ [phase shift] and/or $\theta(t)$ [phase modulation]) and/or frequency information (e.g., $+/-\Delta f$ [frequency shift] and/or $f(t)$ [frequency modulation]). In another embodiment and/or in furtherance of the preceding embodiment, the inbound RF signal(s) includes amplitude information (e.g., $+/-\Delta A$ [amplitude shift] and/or $A(t)$ [amplitude modulation]). To recover the amplitude information, the receiver section includes an amplitude detector such as an envelope detector, a low pass filter, etc.

The baseband processing module 14 converts the one or more inbound symbol streams into inbound data (e.g., voice, text, audio, video, graphics, etc.) in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling. Note that the baseband processing module converts a single inbound symbol stream into the inbound data for Single Input Single Output (SISO) communications and/or for Multiple Input Single Output (MISO) communications and converts the multiple inbound symbol streams into the inbound data for Single Input Multiple Output (SIMO) and Multiple Input Multiple Output (MIMO) communications.

Figure 2:
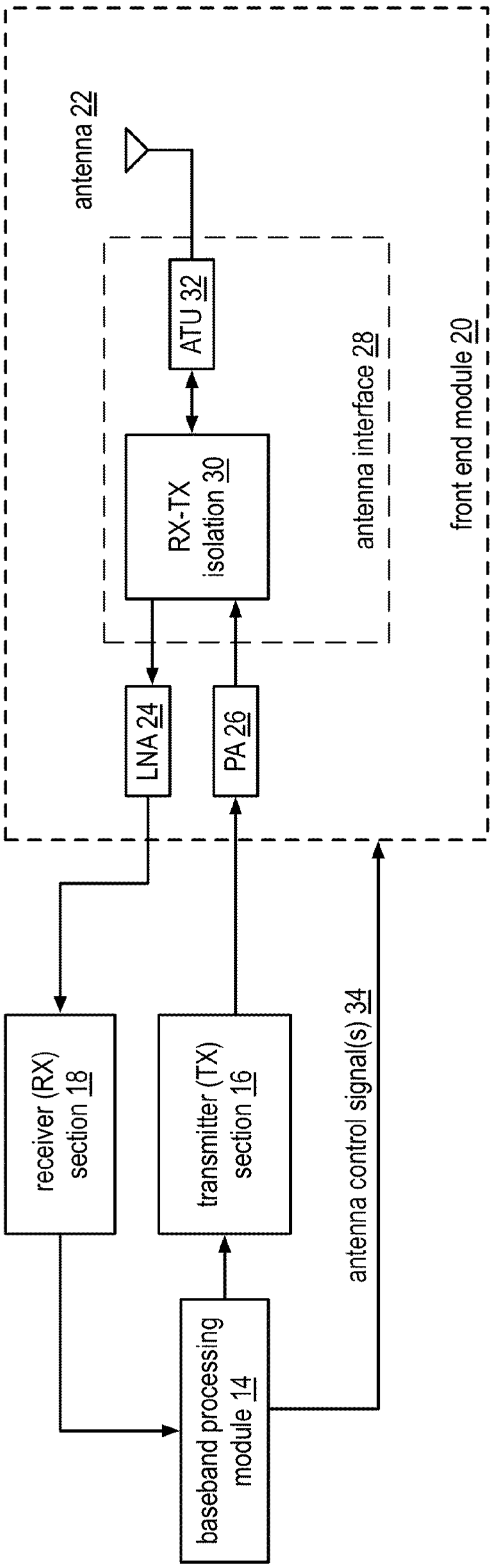
FIG. 2 is a schematic block diagram of an embodiment of a communication device in accordance with the present invention.

FIG. 2 is a schematic block diagram of an embodiment of a communication device 10, 12 that includes the baseband processing module 14, the transmitter section 16, the receiver section 18, and the front-end module, or circuit, 20. The front-end module 20 includes an antenna 22, an antenna interface 28, a low noise amplifier (LNA) 24, and a power amplifier, or power amplifier driver, (PA) 26. The antenna interface 28 includes an antenna tuning unit 32 and a receiver-transmitter isolation circuit 30. Note that the radio front-end 20 may further include one to all of the components of the receiver section 18 and/or may further include one to all of the components of the transmitter section 16.

In an example of operation, the power amplifier 26 amplifies one or more outbound RF signals that it receives from the transmitter section 16. The receiver-transmitter (RX-TX) isolation circuit 30 (which may be a duplexer, a circulator, or transformer balun, or other device that provides isolation between a TX signal and an RX signal using a common antenna) attenuates the outbound RF signal(s). The RX-TX isolation module 30 may adjusts it attenuation of the outbound RF signal(s) (i.e., the TX signal) based on control signals 34 received from the baseband processing unit 14. For example, when the transmission power is relatively low, the RX-TX isolation module 30 may be adjusted to reduce its attenuation of the TX signal. The RX-TX isolation module 30 provides the attenuated outbound RF signal(s) to the antenna tuning unit 32.

The antenna tuning unit (ATU) 32 is tuned to provide a desired impedance that substantially matches that of the antenna 2. As tuned, the ATU 32 provides the attenuated TX signal from the RX-TX isolation module 30 to the antenna 22 for transmission. Note that the ATU 32 may be continually or periodically adjusted to track impedance changes of the antenna 22. For example, the baseband processing unit 14 may detect a change in the impedance of the antenna 22 and, based on the detected change, provide control signals 34 to the ATU 32 such that it changes it impedance accordingly.

The antenna 22, which may be implemented in a variety of ways as discussed with reference to one or more of FIGS. 3-35, transmits the outbound RF signal(s) it receives from the ATU 32. The antenna 22 also receives one or more inbound RF signals, which are provided to the ATU 32. The ATU 32 provides the inbound RF signal(s) to the RX-TX isolation module 30, which routes the signal(s) to the LNA 24 with minimal attenuation. The LNA 24 amplifies the inbound RF signal(s) and provides the amplified inbound RF signal(s) to the receiver section 18.

In an alternate embodiment, the radio front end 20 includes a transmit antenna 22 and a receive antenna 22. In this embodiment, the antenna interface 28 may include two antenna tuning units and omits the RX-TX isolation circuit. Accordingly, isolation is provided between the outbound RF signal(s) and the inbound RF signal(s) via the separate antennas and separate paths to the transmitter section 16 and receiver section 18.

Figure 3:
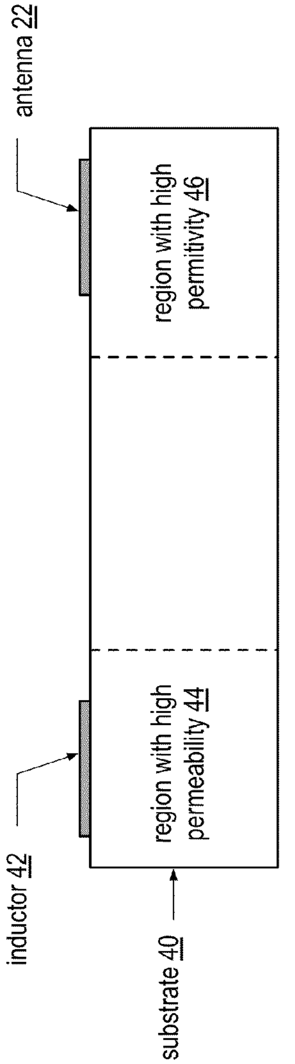
FIG. 3 is a diagram of an embodiment of substrate supporting an antenna and an inductor in accordance with the present invention.

FIG. 3 is a diagram of an embodiment of substrate 40 supporting an antenna 22 and an inductor 42. The substrate 40 includes a first region 44 that has a high permeability (μ) and a second region 46 with a high permittivity (∈). The substrate 40 may be an integrated circuit (IC) die, an IC package substrate, a printed circuit board, and/or portions thereof. The base material of the substrate 40 (i.e., substrate material) may be one or more of, but not limited to, silicon germanium, porous alumina, silicon monocrystals, gallium arsenide, and silicon monocrystals.

As is known, permeability is a measure of the ability of the substrate to support a magnetic field (i.e., it is the degree of magnetization that the substrate obtains in response to a magnetic field and corresponds to how easily the substrate can support a magnetic field). As is also known, permittivity is a measure of how an electric field effects, and is effected by, the substrate (i.e., is a measure of the electric field (or flux) that is generated per unit charge in the substrate and corresponds to how easily the substrate can support an electric field, or electric flux). Note that more electric flux exists in the substrate when the substrate has a high permittivity.

In this instance, the inductor 42 may be a printed inductor fabricated on the substrate in the first region 44 and the antenna 22 may be a printed antenna fabricated on the substrate in the second region 46. The antenna 22 and inductor 42 may be printed on the substrate in one or more metal layers using a conventional printed circuit fabrication process such as etching or depositing. The inductor 42 is placed in the first region 44, which has a high permeability (e.g., increased ability to support a magnetic field). Accordingly, when the inductor is active, the magnetic field it creates is enhanced by the permeability of the first region, which improves the quality factor (Q) of the inductor (i.e., a ratio of the inductive reactance to inductive resistance, where, the higher the Q, the more closely the inductor approaches an ideal inductor). As such, an on-substrate, high Q, inductor is achieved.

The antenna 22 is placed in the second region 46, which has a high permittivity (e.g., ability to support an electric field). Accordingly, when the antenna 22 is active, the electric field it creates is enhanced by the permittivity of the second region 46, which improves the gain and/or impedance of the antenna 22 and may further favorably effect the antenna's radiation pattern, beam width, and/or polarization.

In an application of this circuit, the inductor 42 may be part of the RX-TX isolation circuit 30, the antenna tuning unit 32, the power amplifier 26, or the low noise amplifier 24 of the front end module 20. Further, the first region may support multiple inductors that are incorporated in the front end module. Still further, second region may support multiple antennas 22 functioning as an antenna array, a diversity antenna, etc.

Figure 4:
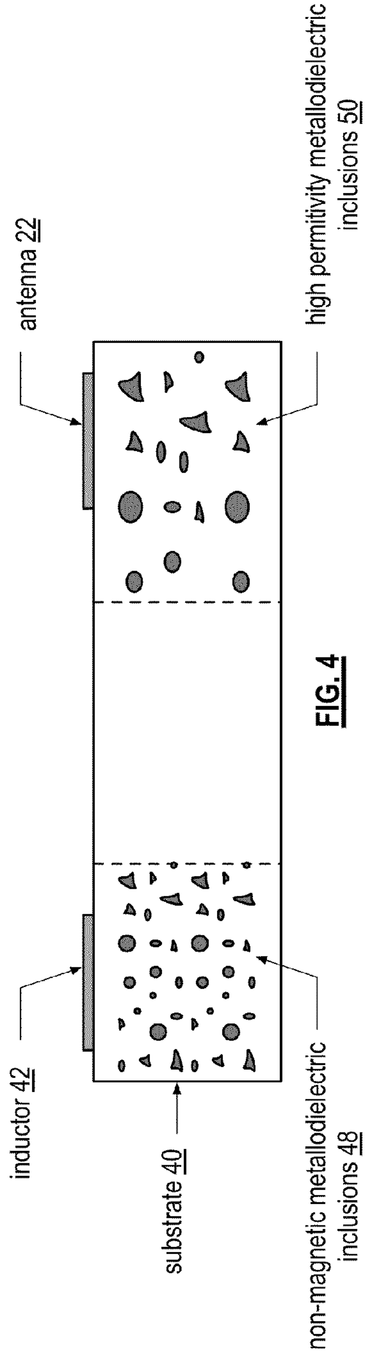
FIG. 4 is a diagram of another embodiment of substrate supporting an antenna and an inductor in accordance with the present invention.

FIG. 4 is a diagram of another embodiment of substrate 40 supporting an antenna 22 and an inductor 42. In this embodiment, the first region 44 includes non-magnetic metallodielectric inclusions 48 embedded in the substrate material of the substrate 40. The non-magnetic metallodielectric inclusions 48 exhibit resonant (high) effective permeability values in desired frequency ranges (e.g. in the inductor's operating frequency).

The second region 46 includes high permittivity metallodielectric inclusions 50 embedded in the substrate. The high permittivity metallodielectric inclusions 50 may be perforated silicon where the substrate loss is comparable to a dielectric and the silicon ceases to be a semi-conductor. The high permittivity metallodielectric inclusions enable the second region to have a with high (resonant) permittivity in specific frequency ranges, which allows for the antenna 22 to be small in comparison to a similarly operational antenna fabricated on a conventional substrate. Note that the size, shape, and/or distribution of the inclusions 48 and 50 in the first and second regions 44 and 46, respectively, may vary to provide a desired permeability and/or desired permittivity.

Figure 5:
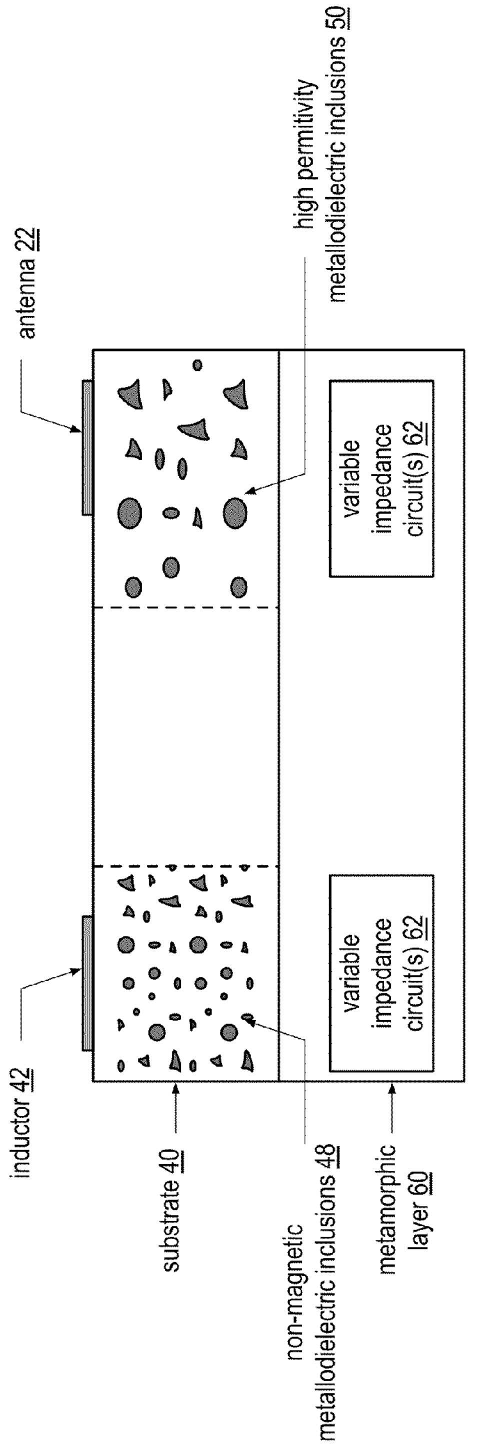
FIG. 5 is a diagram of another embodiment of substrate supporting an antenna and an inductor in accordance with the present invention.

FIG. 5 is a diagram of another embodiment of substrate 40 supporting an antenna 22 and an inductor 42 and further includes a metamorphic layer 60 (which will be described in greater detail with reference to FIGS. 30-32). The substrate 40 includes the non-magnetic metallodielectric inclusions 48 in the first region 44 and includes the high permittivity metallodielectric inclusions 50 in the second region 46.

The metamorphic layer 60 includes one or more first variable impedance circuits 62 associated with the first region 44 and one or more second variable impedance circuits 62 associated with the second region 46 (examples of the variable impedance circuits are described in greater detail with reference to FIGS. 32-35). The first variable impedance circuits 62 are operable to tune the permeability of the first region 44, thereby tuning the properties (e.g., quality factor, inductance, resistance, reactance, etc.) of the inductor 42. The second variable impedance circuits are operable to tune the permittivity of the second region 46, thereby tuning the properties (e.g., gain, impedance, radiation pattern, polarization, beam width, etc.).

Figure 6:
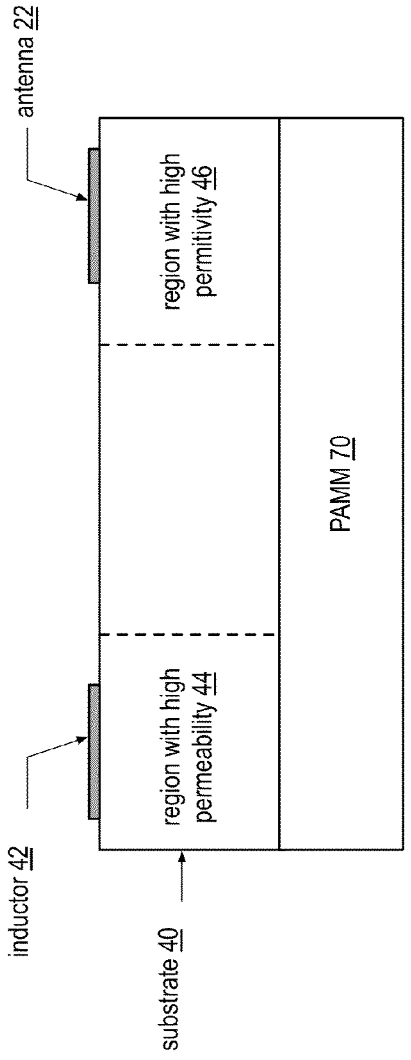
FIG. 6 is a diagram of another embodiment of substrate supporting an antenna and an inductor in accordance with the present invention.

FIG. 6 is a diagram of another embodiment of substrate 40 supporting an antenna 22 and an inductor 42 and further includes a projected artificial magnetic mirror (PAMM) 70 (which will be described in greater detail with reference to FIGS. 7 and 8). The PAMM 70 generates an artificial magnetic conductor (AMC) at a distance above a surface of the semiconductor substrate, which affects the inductor 42 and/or the antenna 22. For example, the AMC may have a parabolic shape to function as a dish for the antenna, which is discussed in greater detail with reference to FIG. 9. As another example, the AMC may affect the magnetic field of the inductor, thereby tuning the properties of the inductor.

Figure 7:
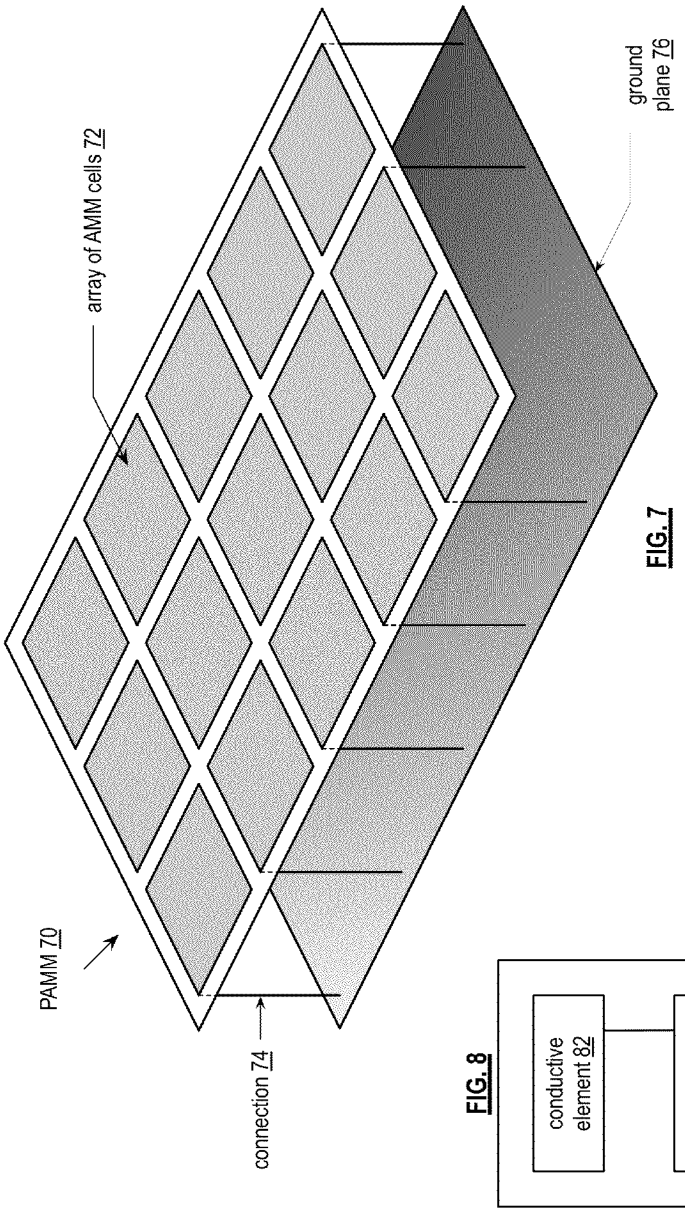
FIG. 7 is a diagram of an embodiment of project artificial magnetic mirror (PAMM) in accordance with the present invention.

FIG. 7 is a diagram of an embodiment of a tunable projected artificial magnetic mirror (PAMM) 70 that includes a plurality, or array, of artificial magnetic mirror (AMM) cells 72. In one embodiment, each of the AMM cells 72 includes a conductive element (e.g., a metal trace on layer of the substrate) that is substantially of the same shape, substantially of the same pattern, and substantially of the same size as in the other cells. The shape may be circular, square, rectangular, hexagon, octagon, elliptical, etc. and the pattern may be a spiral coil, a pattern with interconnecting branches, an $n^{th}$ order Peano curve, an $n^{th}$ order Hilbert curve, etc. In another embodiment, the conductive elements may be of different shapes, sizes, and/or patterns.

Within an AMM cell, the conductive element may be coupled to the ground plane 76 by one or more connectors 74 (e.g., vias). Alternatively, the conductive element of an AMM cell may be capacitively coupled to the ground plane 76 (e.g., no vias). While not shown in this figure, a conductive element of an AMM cell is coupled to an impedance element of the AMM cell, which will be further discussed with reference to one or more subsequent figures.

The plurality of conductive elements of the AMM cells is arranged in an array (e.g., 3×5 as shown). The array may be of a different size and shape. For example, the array may be a square of n-by-n conductive elements, where n is 2 or more. As another example, the array may be a series of concentric rings of increasing size and number of conductive elements. As yet another example, the array may be of a triangular shape, hexagonal shape, octagonal shape, etc.

Figure 8:
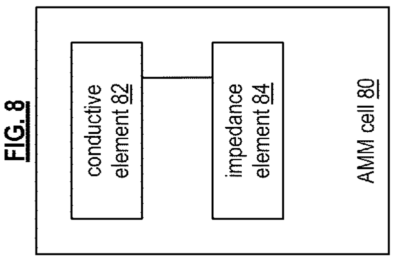
FIG. 8 is a diagram of an embodiment of an artificial magnetic mirror (AMM) cell of a PAMM in accordance with the present invention.

FIG. 8 is a schematic block diagram of an embodiment of an artificial magnetic mirror (AMM) cell 80 of the plurality of AMM cells 72. The AMM cell 80 includes a conductive element 22 and an impedance element 84, which may be fixed or variable. The conductive element is constructed of an electrically conductive material (e.g., a metal such as copper, gold, aluminum, etc.) and is of a shape (e.g., a spiral coil, a pattern with interconnecting branches, an $n^{th}$ order Peano curve, an $n^{th}$ order Hilbert curve, etc.) to form a lumped resistor-inductor-capacitor (RLC) circuit (examples are discussed with reference to FIGS. 32-33).

The impedance element 84 is coupled to the conductive element 82. An impedance of the impedance element 84 and an impedance of the RLC circuit establish an electromagnetic property (e.g., radiation pattern, polarization, gain, scatter signal phase, scatter signal magnitude, gain, etc.) for the AMM cell within the given frequency range, which contributes to the size, shape, orientation, and/or distance of the AMC. Examples of variable impedance elements are discussed in greater detail with reference to FIGS. 34-35.

Figure 9:
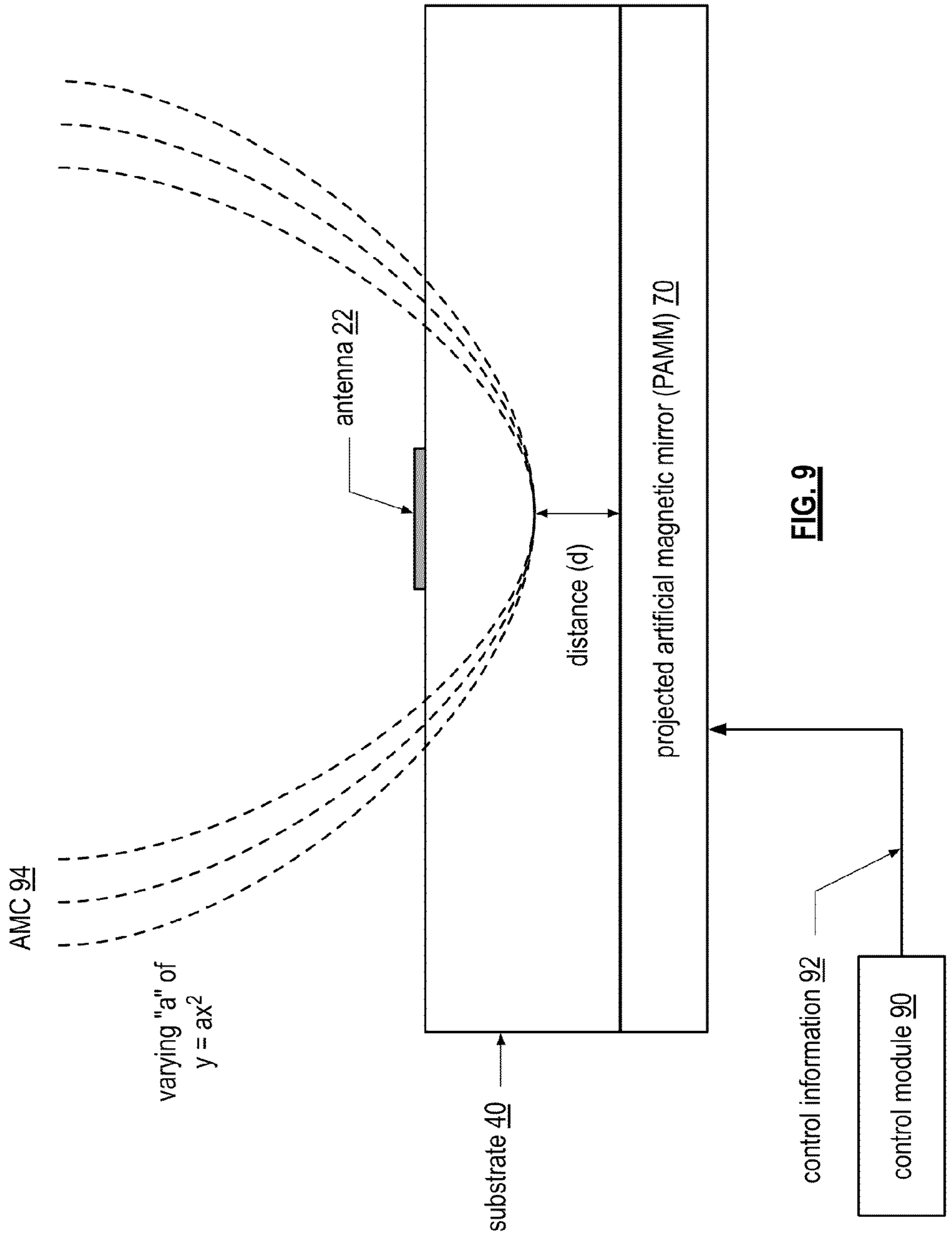
FIG. 9 is a diagram of an embodiment of an antenna having an artificial magnetic conductor (AMC) produced by a project artificial magnetic mirror in accordance with the present invention.

FIG. 9 is a diagram of an antenna 22 having a substrate 40 and a projected artificial magnetic mirror (PAMM) 70 generating a projected artificial magnetic conductor (AMC) 94 a distance (d) above its surface. The shape of the projected AMC 94 is based on the characteristics of the artificial magnetic mirror (AMM) cells of the PAMM 70, wherein the characteristics are adjustable via the control information 92 as produced by control module 90. In this example, the projected AMC 94 is a parabolic shape of $y=ax^2$. The control module 90 generates the control information 92 to tune the "a" term of the parabolic shape, thereby changing the parabolic shape of the AMC 94. Note that the antenna 22 is placed at the focal point of the parabola. The substrate 40 may include substrate inclusions (e.g., non-magnetic metallodielectric inclusions and/or high permittivity metallodielectric inclusions) and may further include a metamorphic layer that supports one or more variable impedance circuits to have tuned and/or adjustable permeability and/or permittivity regions.

Figure 10:
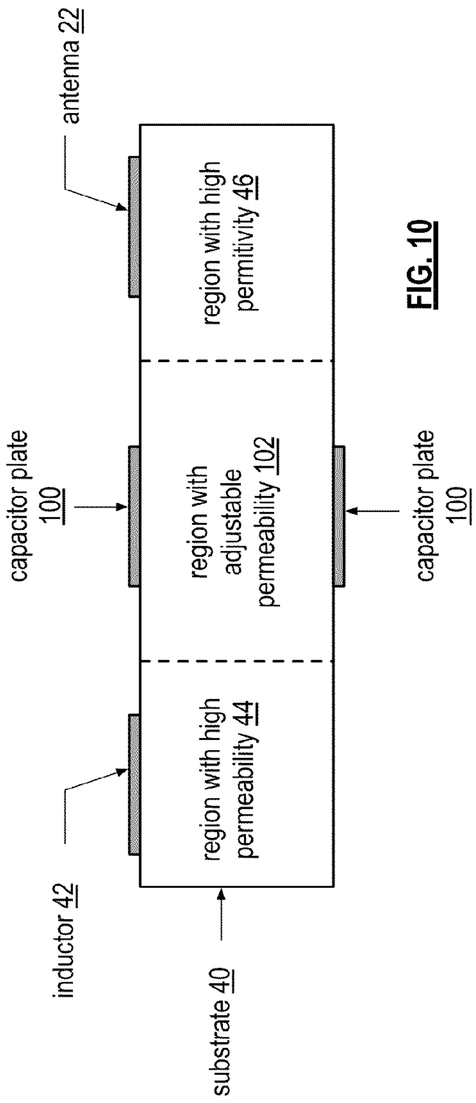
FIG. 10 is a diagram of an embodiment of substrate supporting a varactor, an antenna, and an inductor in accordance with the present invention.

FIG. 10 is a diagram of an embodiment of substrate 40 supporting a varactor, an antenna 22, and an inductor 42. The varactor includes two capacitive plates 100 that are on metal layers juxtaposed to the major surfaces of the substrate 40 to produce a capacitor. In this region of the substrate 40, the permittivity is adjustable (e.g., via a PAMM or via variable impedance circuits in a metamorphic layer). As is known, capacitance of a capacitor is a function of the physical dimensions of the capacitor plates, the distance between the plates, and the permittivity of the dielectric separating the plates. As such, by adjusting the permittivity of the substrate, the capacitance of the capacitor changes, thereby functioning as a varactor.

In an application of this circuit, the inductor 42 and/or varactor may be part of the RX-TX isolation circuit 30, the antenna tuning unit 32, the power amplifier 26, or the low noise amplifier 24 of the front end module 20. Further, the first region may support multiple varactors that are incorporated in the front end module. Still further, second region may support multiple antennas 22 functioning as an antenna array, a diversity antenna, etc.

Figure 11:
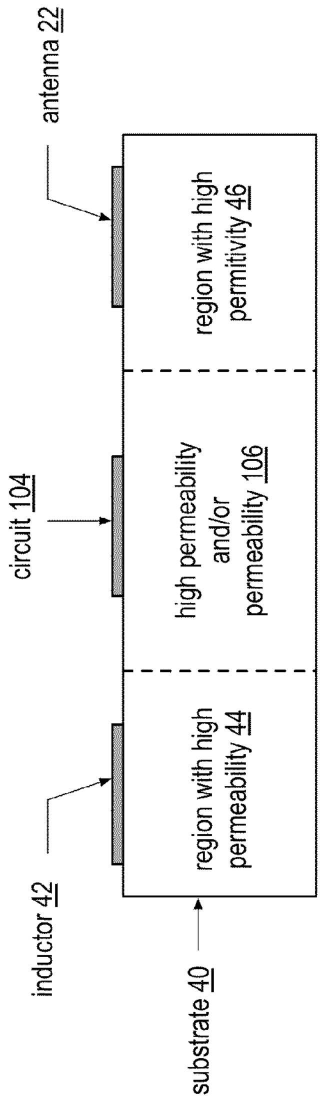
FIG. 11 is a diagram of an embodiment of substrate supporting a circuit, an antenna, and an inductor in accordance with the present invention.

FIG. 11 is a diagram of an embodiment of substrate 40 supporting a circuit 104, an antenna 22, and an inductor 42. The circuit 104 is supported in a region of the substrate that has a high permeability and/or a high permittivity 106. As an example, if operation of the circuit 104 is based on a magnetic field, then the region supporting the circuit may have a high permeability. As another example, if the operation of the circuit 104 is based on an electric field, then the region supporting the circuit may have a high permittivity.

In various implementations, the circuit 104 may be a resistor, a transistor, a capacitor, an inductor, a diode, a duplexer, a diplexer, a load for a power amplifier, and/or a phase shifter. In these implementations, the region may be divided into many sub-regions, where one of the sub-regions has a high permeability to support a magnetic field based component of the circuit and another sub-region has a high permittivity to support an electric field based component of the circuit.

Figure 13:
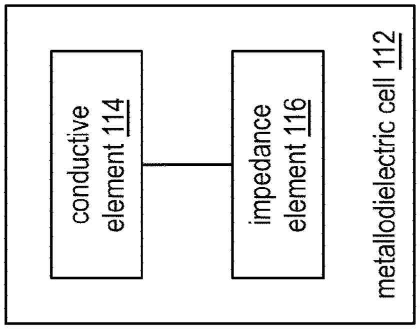
FIG. 13 is a diagram of an embodiment of a metallodielectric cell in accordance with the present invention.
Figure 12:
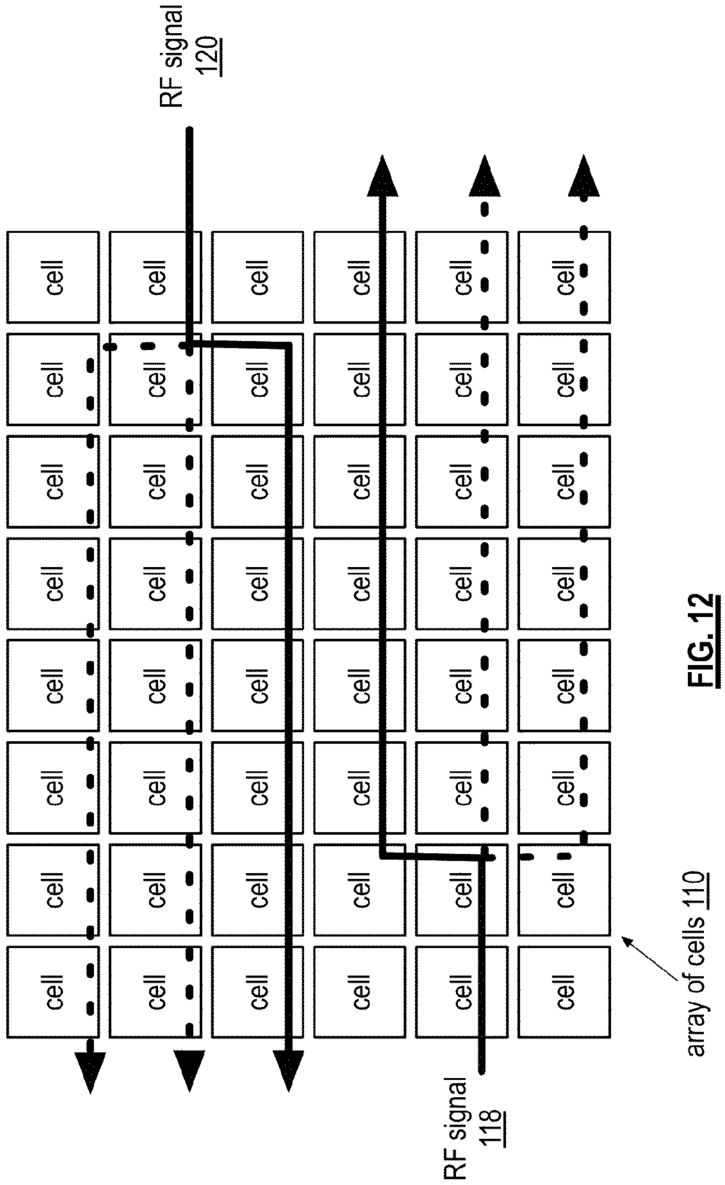
FIG. 12 is a diagram of an embodiment of an array of metallodielectric cells functioning as a radio frequency (RF) switch in accordance with the present invention.

FIG. 12 is a diagram of an embodiment of an array 110 of metallodielectric cells functioning as a radio frequency (RF) switch. The array 110 of cells may be implemented on the substrate 40 and/or on a metamorphic layer 60. In either case and as shown in FIG. 13, a metallodielectric cell 112 includes a conductive element 114 forming a lumped resistor-inductor-capacitor (RLC) circuit and an impedance element 116. An impedance of the impedance element 116 and an impedance of the RLC circuit 114 establish an electromagnetic property for the cell to function as a bandpass filter that allow signals within the given frequency range to pass. Examples of the metallodielectric cells 112 are discussed in greater detail with reference to FIGS. 32-35.

In an example of operation, some of the metallodielectric cells are tuned to steer an electromagnetic signal 118 and/or 120 through the plurality of metallodielectric cells via a distinct path to effectively provide a radio frequency (RF) switch. For example, RF signal 118 may be an outbound RF signal and RF signal 120 may be an inbound RF signal; both being of a particular protocol and thus being in a particular frequency band. Accordingly, a certain arrangement of cells are tuned to allow RF signal 118 to flow through the cells while the cells around the certain arrangement are tuned to block the RF signal 118. Similarly, a certain arrangement of cells are tuned to allow RF signal 120 to flow through the cells while the cells around this certain arrangement are tuned to block the RF signal 120.

If, in a multi-mode communication device, another protocol is used that has a different frequency band, the certain arrangement of cells can be changed to steer the RF signals 118 and 120 along different paths. In this manner, the cells, as tuned, provide an effective RF switch that has a magnitude of applications in RF communications.

Figure 14:
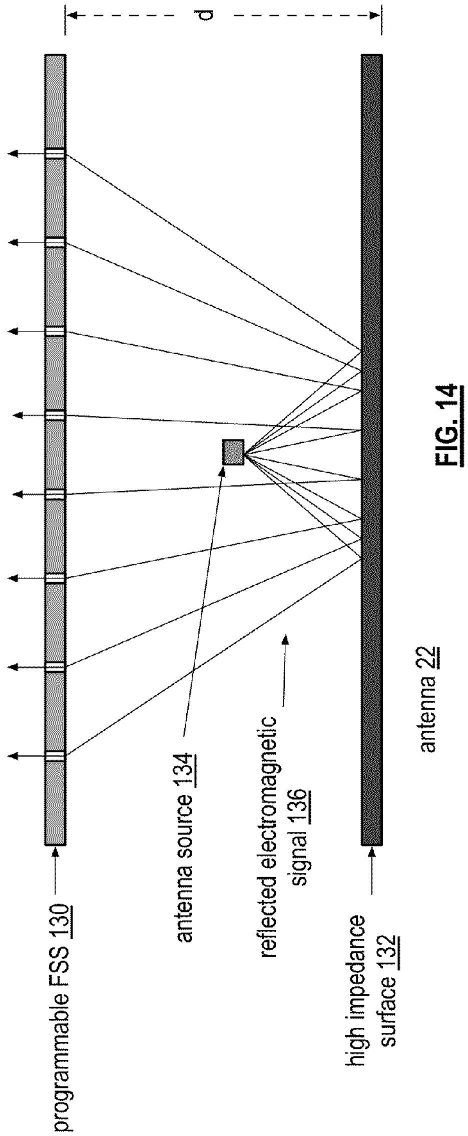
FIG. 14 is a diagram of an embodiment of an antenna in accordance with the present invention.

FIG. 14 is a diagram of an embodiment of an antenna 22 (e.g., a Fabry-Perot antenna) that includes a programmable frequency selective surface (FSS) 130, a high impedance surface 132, and an antenna source 134. The programmable FSS 130 is at a distance (d) from, and is substantially parallel to, the high impedance surface 132.

In an example of operation, the antenna source 134 radiates an electromagnetic signal 136 that reflects off of the high impedance surface 132 and radiates through the programmable frequency selective surface 130. The programmable FSS 130 includes a plurality of slots that is arranged in a grid of rows and columns, is arranged linearly, or in some other pattern. The slots may be physical holes through, or partially, through the programmable FSS 130 and/or may be electromagnetic holes created by controlling electromagnetic properties of the antenna, the programmable FSS, the high impedance surface 132, and/or the antenna source 134. For instance, one or more the electromagnetic characteristics (E field, magnetic field, impedance, radiation pattern, polarization, gain, scatter signal phase, scatter signal magnitude, gain, permittivity, permeability, conductivity, etc.) of the programmable frequency selective surface 130 is tuned to affect the effective size, shape, position of at least some of the slots thereby adjusting the radiation pattern, frequency band of operation, gain, impedance, beam scanning, and/or beam width of the antenna.

The antenna source 134 may be a dipole antenna and its position may be effectively changed by changing the properties of a supporting substrate. For instance, by changing the effective position of the antenna source 134, the manner in which the electromagnetic signal reflects off of the high impedance surface changes, thereby changing operation of the antenna 22.

Figure 15:
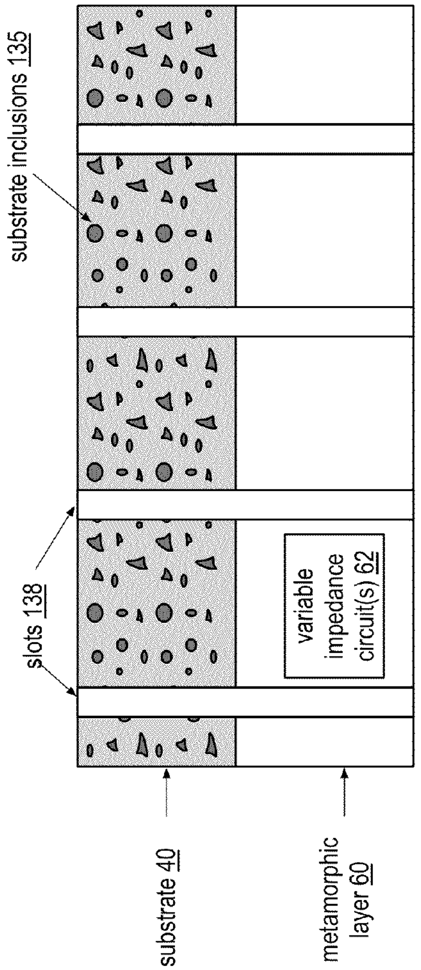
FIG. 15 is a diagram of an embodiment of a programmable frequency selective surface (FSS) of the antenna of FIG. 14 or 16 in accordance with the present invention.
Figure 16:
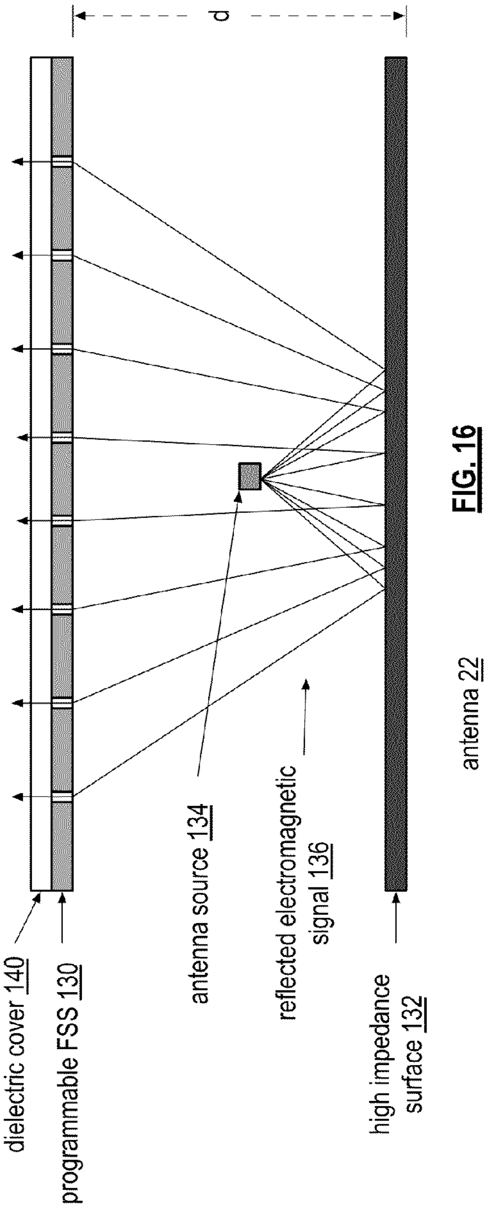
FIG. 16 is a diagram of another embodiment of an antenna in accordance with the present invention.

FIG. 15 is a diagram of an embodiment of a programmable frequency selective surface (FSS) 130 of the antenna of FIG. 14 or 16 that includes a substrate 40, a metamorphic layer 60, slots 138, and one or more variable impedance circuits 62. The substrate 40 has embedded therein substrate inclusions 135 (e.g., non-magnetic metallodielectric inclusions and/or high permittivity metallodielectric inclusions) to provide desired base permittivity, permeability, and conductivity characteristics for the programmable FSS 130.

FIG. 16 is a diagram of another embodiment of an antenna 22 (e.g., a Fabry-Perot antenna) that includes a dielectric cover 140, a programmable frequency selective surface (FSS) 130, a high impedance surface 132, and an antenna source 134. The dielectric cover 140 may include one or more dielectric layers, which may be solid layers and/or include vias to provide an electromagnetic band-gap.

Figure 17:
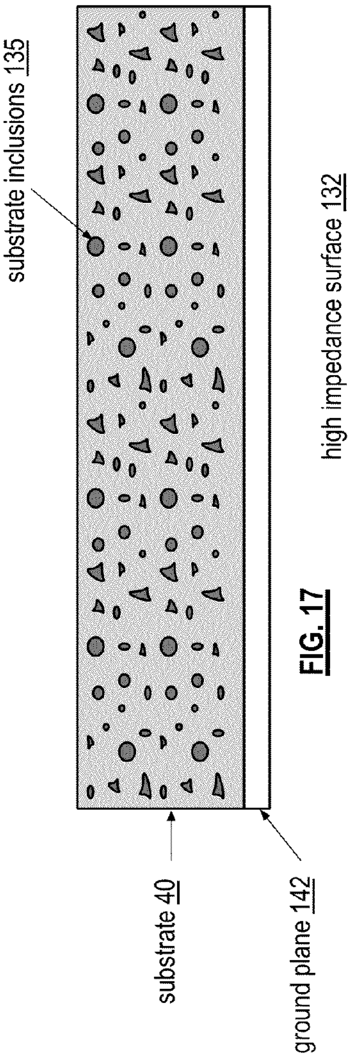
FIG. 17 is a diagram of an embodiment of a high impedance surface of the antenna of FIG. 14 or 16 in accordance with the present invention.

FIG. 17 is a diagram of an embodiment of a high impedance surface 132 of the antenna of FIG. 14 or 16 that includes a substrate 40 and a ground plane 142. The substrate 40 has a surface substantially parallel to, and at the distance from, the programmable frequency selective surface 130 and includes, embedded therein, substrate inclusions 135 (e.g., non-magnetic metallodielectric inclusions and/or high permittivity metallodielectric inclusions) to provide desired base permittivity, permeability, and conductivity characteristics for the high impedance surface 132.

Figure 18:
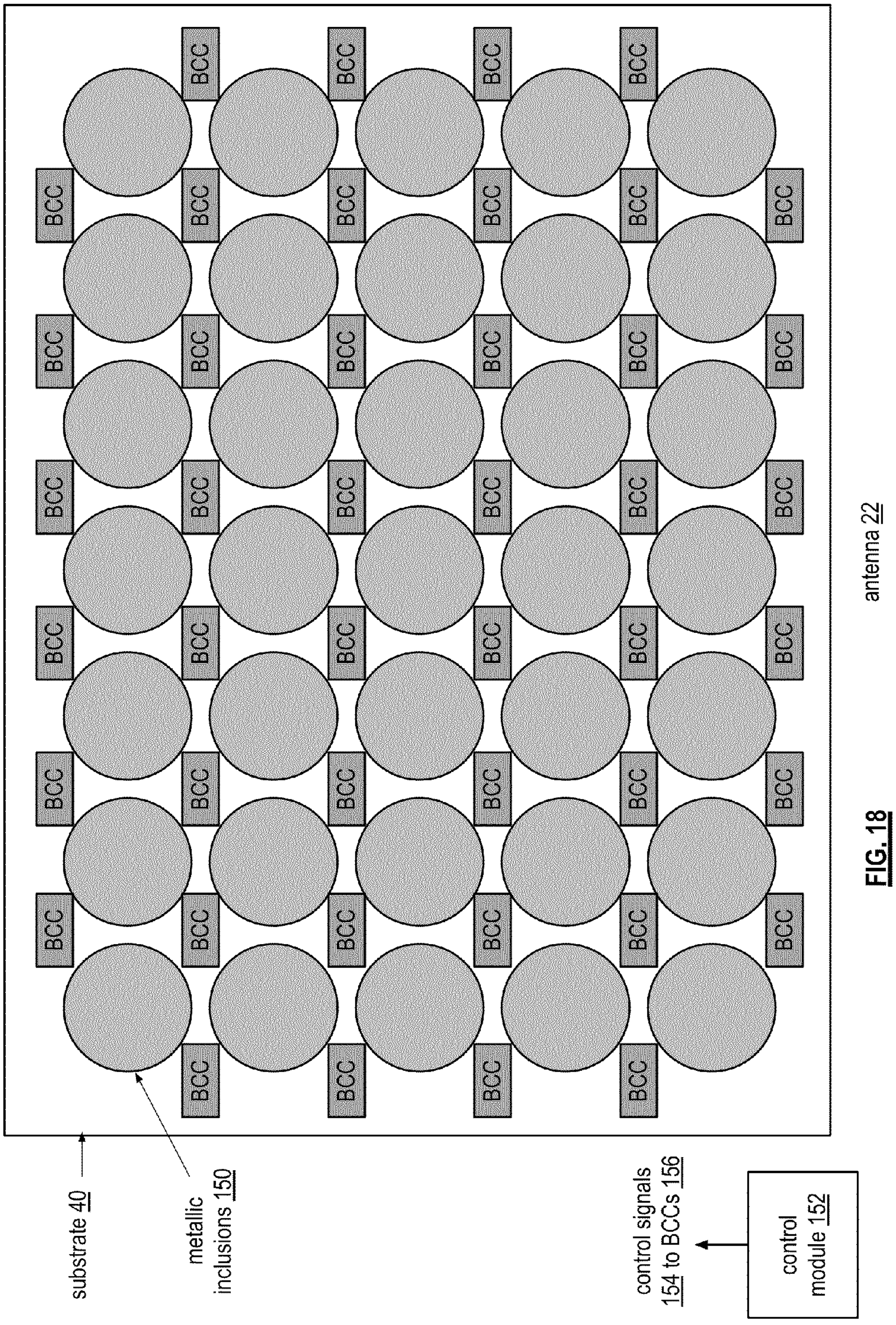
FIG. 18 is a diagram of an embodiment of a programmable antenna in accordance with the present invention.

FIG. 18 is a diagram of an embodiment of a programmable antenna 22 that includes a substrate 40, metallic inclusions 150 embedded within a region of the substrate 40, bidirectional coupling circuits (BCC) 156, and a control module 152. Note that the substrate 40 may be an integrated circuit (IC) die having a material of one of: silicon germanium, porous alumina, silicon monocrystals, and gallium arsenide, an IC package substrate including at least one of: a non-conductive material and a semi-conductive material, and/or a printed circuit board (PCB) substrate including at least one of: a PCB non-conductive material and a PCB semi-conductive material.

The bidirectional coupling circuits (BCC) 156 are physically distributed within the region and are physically proximal to the metallic inclusions 150. A circle, as shown, may include one to hundreds of metallic inclusions 150 of the same size, of different sizes, of the same shape, of different shapes, of a uniform spacing, and/or of a random spacing. Note that the size, or sizes, of the metallic inclusions are a fraction of a wavelength of a signal transmitted or received by the antenna.

In an example of operation, the control module 152 generates control signals 154 to activate a set of bidirectional coupling circuits 156 (e.g., bidirectional switches, transistor, amplifiers, etc.). The control module 152 transmits the control signals 154 to the bidirectional coupling circuits 156 via a grid of traces, which may be on one or more layers of the substrate. With the set of bidirectional coupling circuits active, it interconnects a set of metallic inclusions 150 to provide a conductive area within the region, wherein the conductive area provides an antenna 22.

Figure 19:
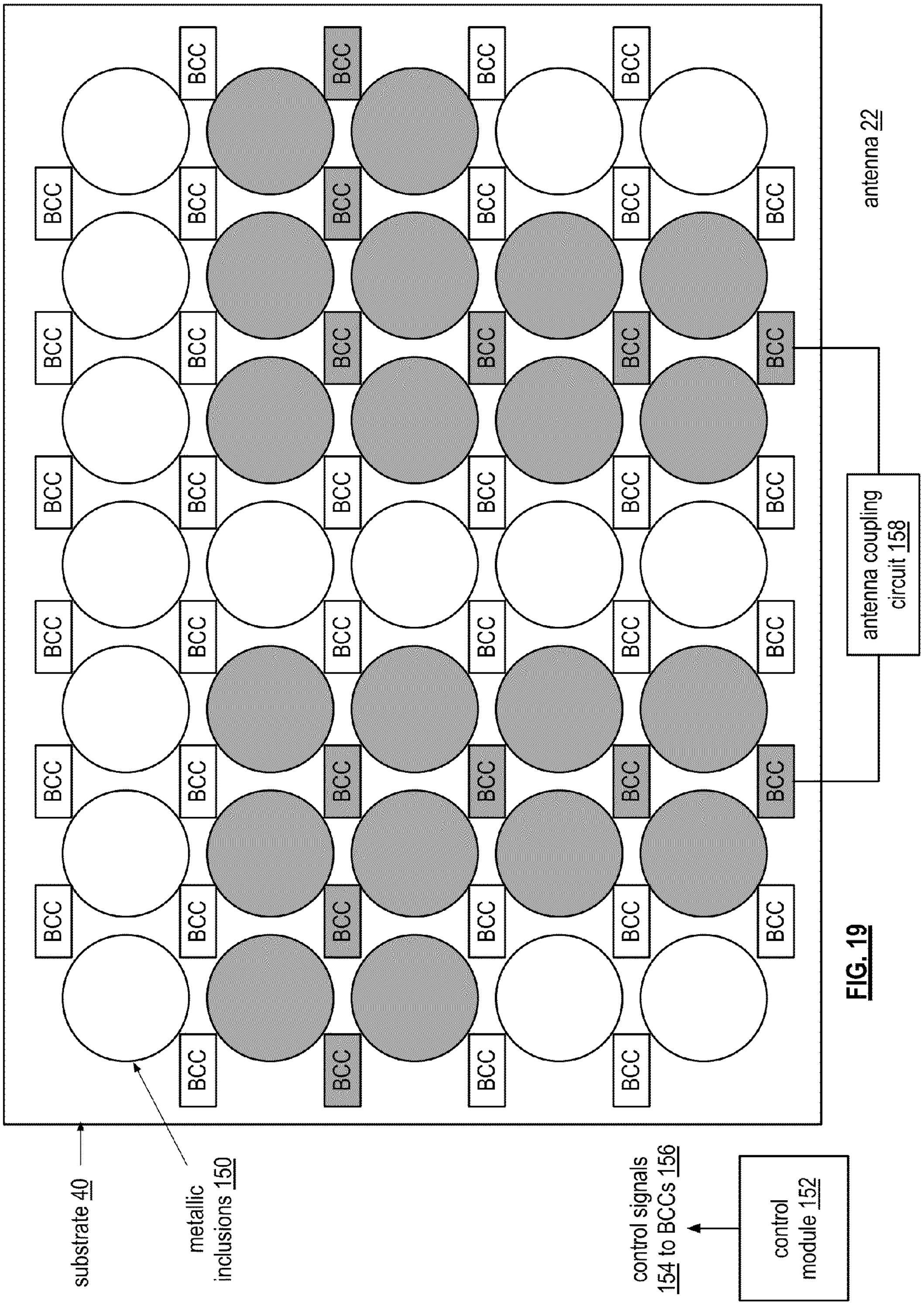
FIG. 19 is a diagram of an example of operation of a programmable antenna in accordance with the present invention.

FIG. 19 is a diagram of an example of operation of a programmable antenna 22 in which the control module 152 generates control signals 154 to activate a set of bidirectional coupling circuits 156 (e.g., the grey shaded BCCs). With the set of bidirectional coupling circuits active, it interconnects a set of metallic inclusions 150 (e.g., the grey shaded inclusions) to provide a conductive area within the region. In this example the conductive area provides a dipole antenna 22.

To provide connectivity to the antenna 22, an antenna coupling circuit 158 (e.g., the antenna interface 28 of FIG. 2) is included. The antenna coupling circuit 158 is couple to one or more BCCs, which are active via the control signals 154.

Figure 20:
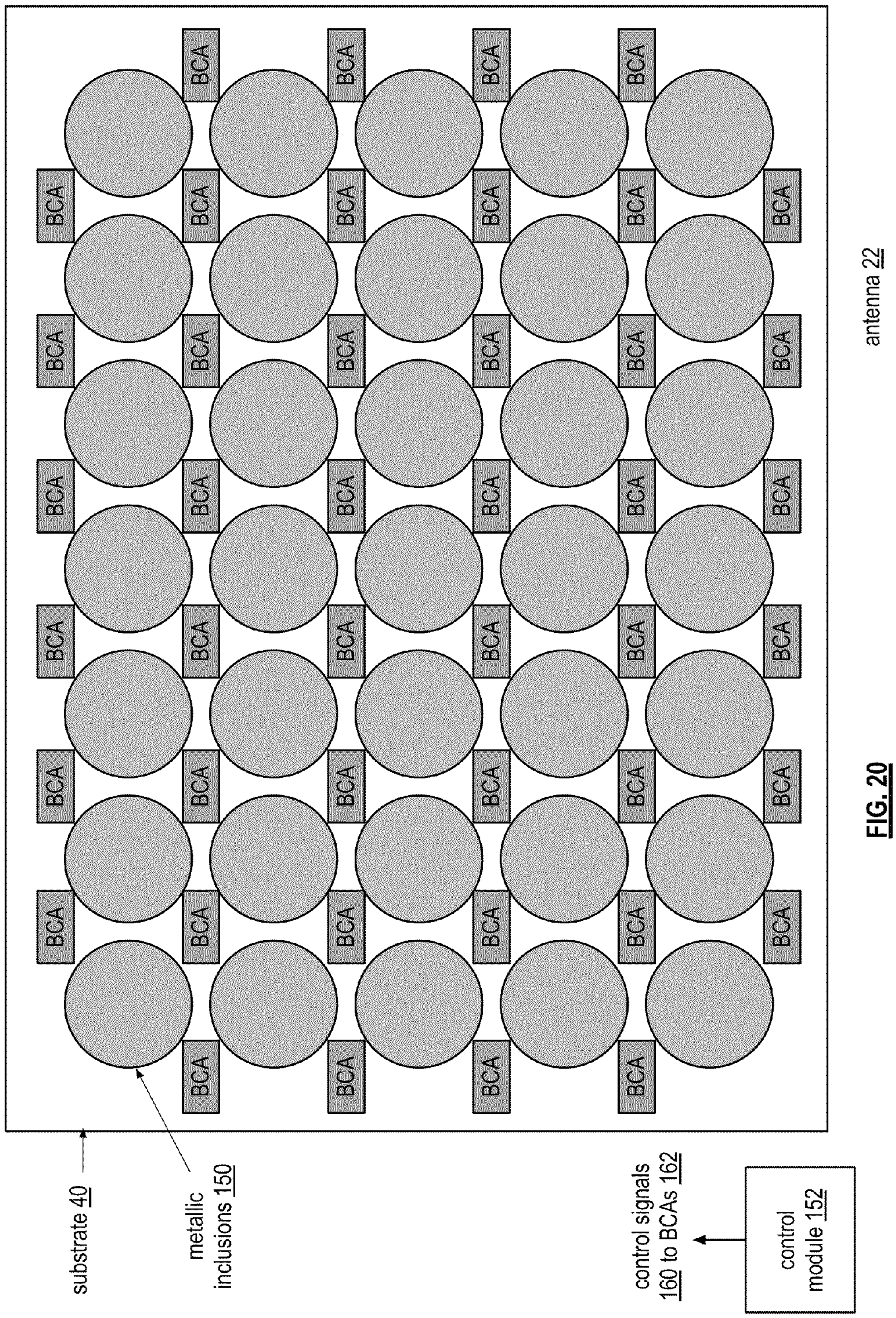
FIG. 20 is a diagram of another embodiment of a programmable antenna in accordance with the present invention.

FIG. 20 is a diagram of another embodiment of a programmable antenna 22 that includes a substrate 40, metallic inclusions 150 embedded within a region of the substrate 40, bidirectional current amplifiers (BCA) 162, and a control module 152. The BCAs 162 are physically distributed within the region and are physically proximal to the metallic inclusions 150. A circle, as shown, may include one to hundreds of metallic inclusions 150 of the same size, of different sizes, of the same shape, of different shapes, of a uniform spacing, and/or of a random spacing. Note that the size, or sizes, of the metallic inclusions are a fraction of a wavelength of a signal transmitted or received by the antenna.

In an example of operation, the control module 152 generates control signals 154 to activate a set of bidirectional current amplifiers 162. The control module 152 transmits the control signals 154 to the bidirectional current amplifiers 162 via a grid of traces, which may be on one or more layers of the substrate. With the set of bidirectional current amplifiers active, it interconnects a set of metallic inclusions 150 to provide a conductive area within the region, wherein the conductive area provides an antenna 22.

Figure 21:
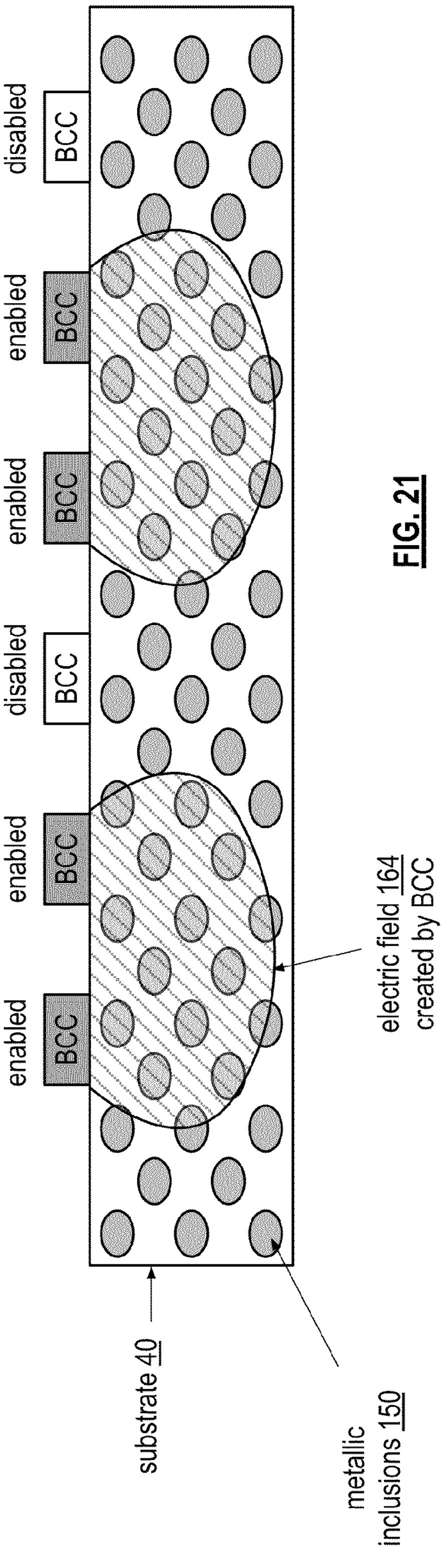
FIG. 21 is a diagram of another example of operation of a programmable antenna in accordance with the present invention.

FIG. 21 is a diagram of another example of operation of a programmable antenna 22 that includes a substrate 40, metallic inclusions 150 embedded within a region of the substrate 40, bidirectional coupling circuits (BCC) 156, and a control module 152. In this diagram, the enabled BCCs create an electric field 164 that encompasses several metallic inclusions 150. The electric field electrically couples the metallic inclusions 150 within the field to produce a conductive area of the region, which provides a portion of the antenna. The BCCs that are not enabled, do not create an electric field and, thus, the metallic inclusions in these areas are not electrically coupled together. As such, these areas remain as semiconductors or dielectrics.

Figure 22:
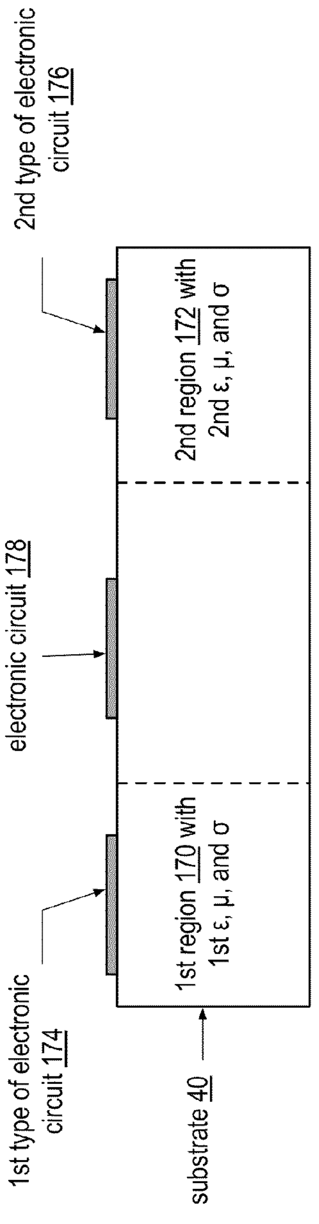
FIG. 22 is a diagram of an embodiment of substrate supporting a plurality of electronic circuits in accordance with the present invention.

FIG. 22 is a diagram of an embodiment of substrate 40 supporting electronic circuits 174-178 (e.g., a capacitor, a resistor, an inductor, a transistor, a diode, an antenna, and/or combinations thereof). The substrate 40 (e.g., silicon germanium, porous alumina, silicon monocrystals, and/or gallium arsenide) includes a first region 170 having first permittivity, permeability, and conductivity characteristics and a second region 172 having second permittivity, permeability, and conductivity characteristics. Circuits of a first type 174 are supported in the first region and circuits of a second type 176 are supported in the second region 172. Other types of circuits 178 are supported in other regions of the substrate.

There are a variety of examples for placing certain types of electronic circuits in certain regions of a substrate 40 having tuned permittivity, permeability, and conductivity characteristics. For example, an inductor's quality factor is enhanced in a region with high permeability. As another example, an antenna's characteristics (e.g., gain, impedance, beam width, radiation pattern, polarization, etc.) are enhanced (e.g., more gain, less impedance) in a region with a high permittivity. As yet another example, when a resistor or transistor is used in a circuit operable in a given frequency band, it may be desirable to enhance to capacitive component and suppress the inductive component of these components, or vise versa. In this specific example, placing the resistor or transistor in a high permeability region enhances the inductive component and placing the resistor or transistor in a high permittivity region enhances the capacitive component.

Figure 23:
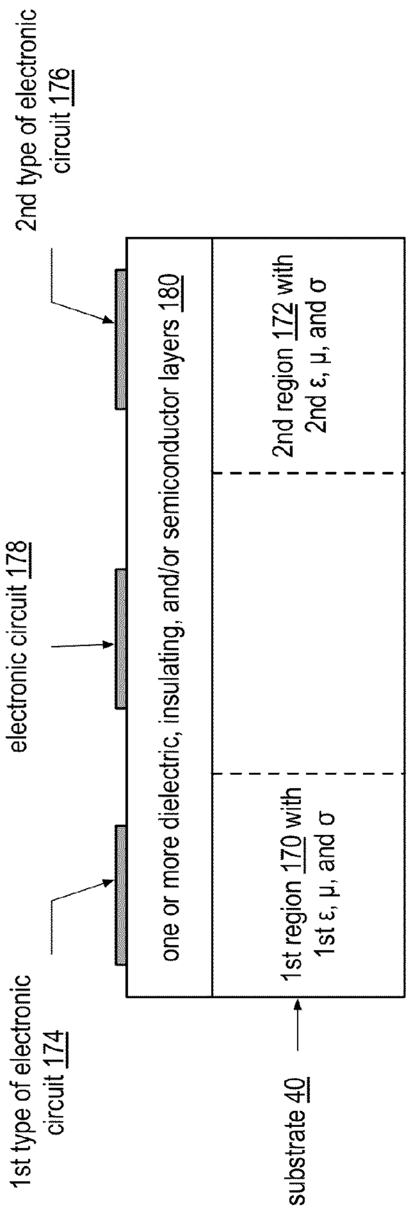
FIG. 23 is a diagram of another embodiment of substrate supporting a plurality of electronic circuits in accordance with the present invention.

FIG. 23 is a diagram of another embodiment of a substrate 40 supporting electronic circuits 174-178. The substrate 40 further includes one or more other layers 180, which may be a dielectric layer, an insulating layer, and/or a semiconductor layer. The one or more other layers 180 may include substrate inclusions (e.g., non-magnetic metallodielectric inclusions and/or high permittivity metallodielectric inclusions) to provide desired permittivity, permeability, and conductivity characteristics (e.g., high permittivity, high permeability, low permittivity, low permeability, etc.).

Figure 24:
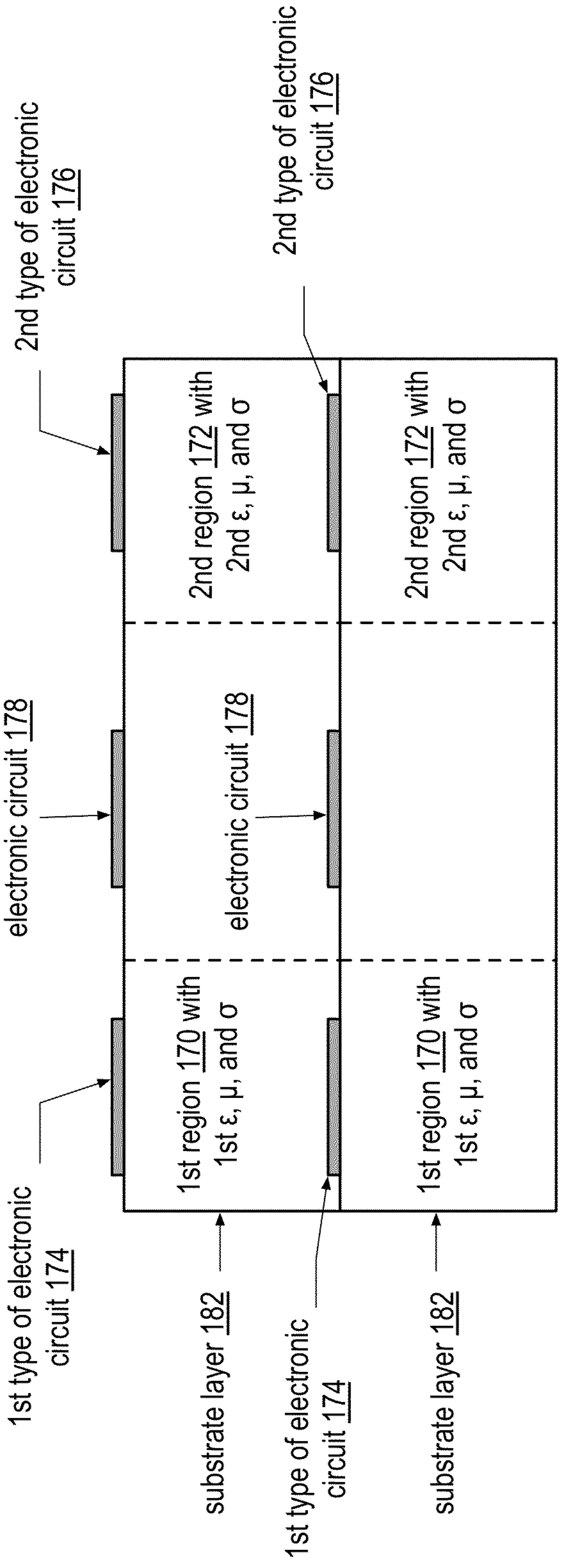
FIG. 24 is a diagram of another embodiment of substrate supporting a plurality of electronic circuits in accordance with the present invention.

FIG. 24 is a diagram of another embodiment of substrate 40 having multiple substrate layers 182. One or more of the substrate layers 182 supports electronic circuits and has regions with tuned permittivity, permeability, and conductivity characteristics. For example, stacked substrate layers 182 may have overlapping regions (e.g., $1^{st}$ and $2^{nd}$) for support $1^{st}$ and $2^{nd}$ type electronic circuits 174 and 176.

Figure 25:
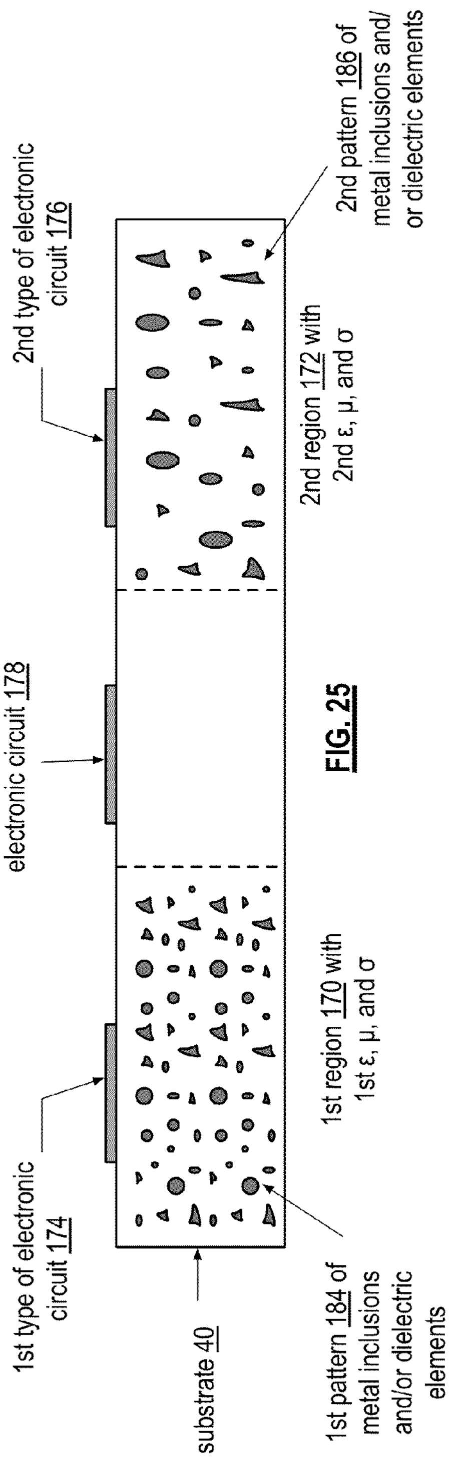
FIG. 25 is a diagram of another embodiment of substrate supporting a plurality of electronic circuits in accordance with the present invention.

FIG. 25 is a diagram of another embodiment of substrate 40 supporting a electronic circuits 174-176. In this embodiment, the semiconductor substrate, in the first region 170, includes a first embedding pattern of substrate inclusions (e.g., metallic inclusions and/or dielectric inclusions) to produce the first permittivity, permeability, and conductivity characteristics. Further, the semiconductor substrate, in the second region 176, includes a second embedding pattern of the substrate inclusions to produce the second permittivity, permeability, and conductivity characteristics.

The first embedding pattern indicates a first quantity of the substrate inclusions, a first spacing of the substrate inclusions, and/or a first variety of sizes of the substrate inclusions. The second embedding pattern indicates a second quantity of the substrate inclusions, a second spacing of the substrate inclusions, and/or a second variety of sizes of the substrate inclusions. Note that the substrate inclusions may be non-magnetic metallodielectric inclusions, high permittivity metallodielectric inclusions, discrete RLC on-die components, and a printed metallization within one or more layers of the substrate.

Figure 26:
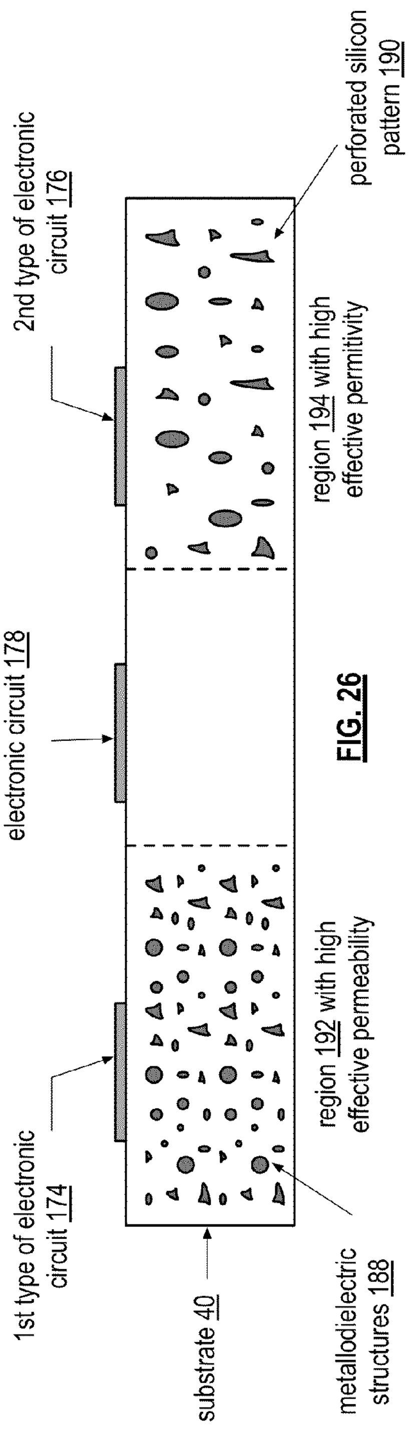
FIG. 26 is a diagram of another embodiment of substrate supporting a plurality of electronic circuits in accordance with the present invention.

FIG. 26 is a diagram of another embodiment of substrate 40 supporting electronic circuits 174-178. In this embodiment, the substrate 40 has a region 192 with high effective permeability for supporting the first type of circuits 174 (e.g., operation is based on a magnetic field). The substrate 40 also includes a region 194 with high permittivity for supporting second types of circuits 176 (e.g., operation is based on an electric field). The high permeability region 192 is produced by including metallodielectric structures 188 in the substrate. The high permittivity region 194 is produced by including a perforated silicon pattern in the substrate 40.

Figure 27:
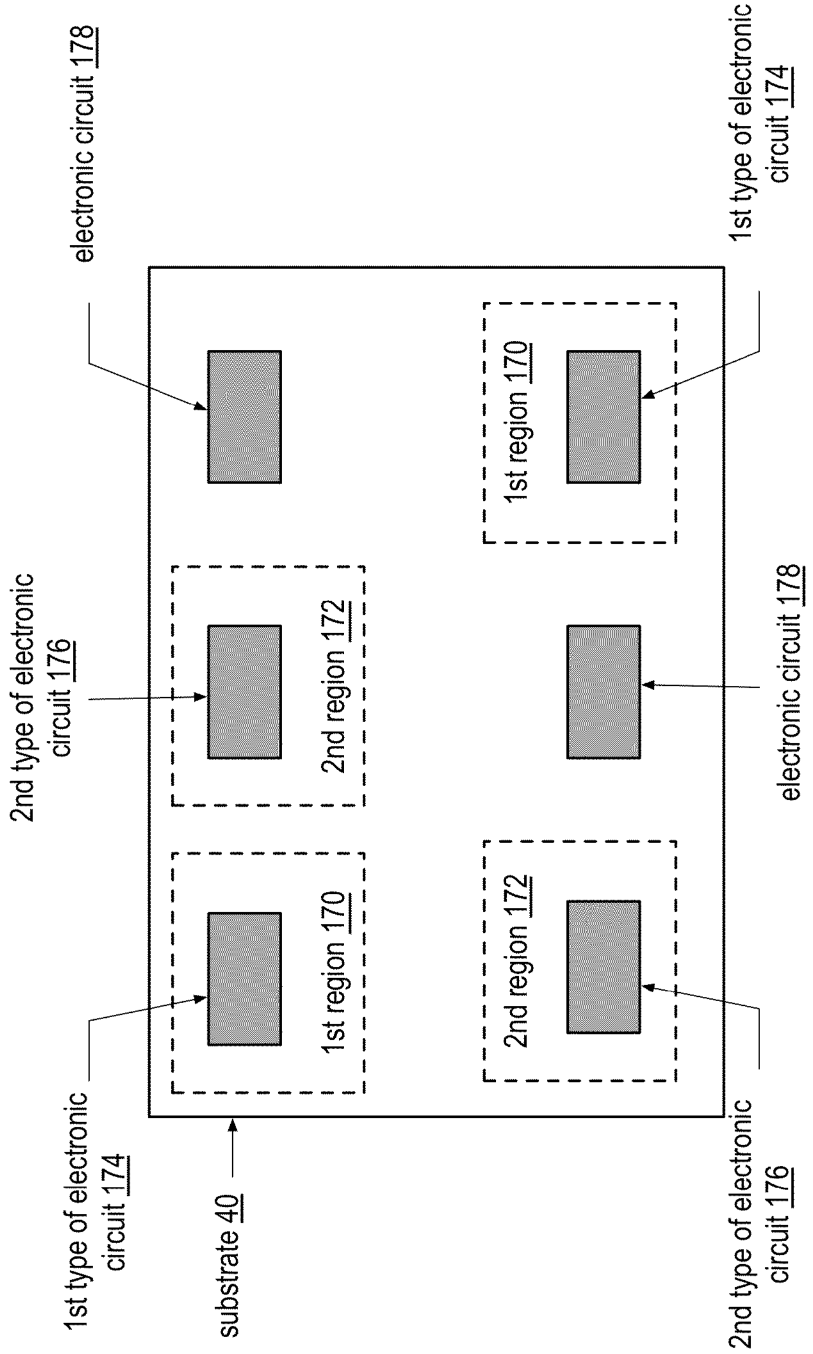
FIG. 27 is a diagram of another embodiment of substrate supporting a plurality of electronic circuits in accordance with the present invention.

FIG. 27 is a diagram of another embodiment of substrate 40 supporting electronic circuits 174-178. In this embodiment, the substrate 40 includes a plurality of regions 170 and a plurality of second regions 172. Each of the first regions 170 supports one or more first type of electronic circuits 174 and each of the second regions 172 supports one or more second type of electronic circuits 176.

Figure 28:
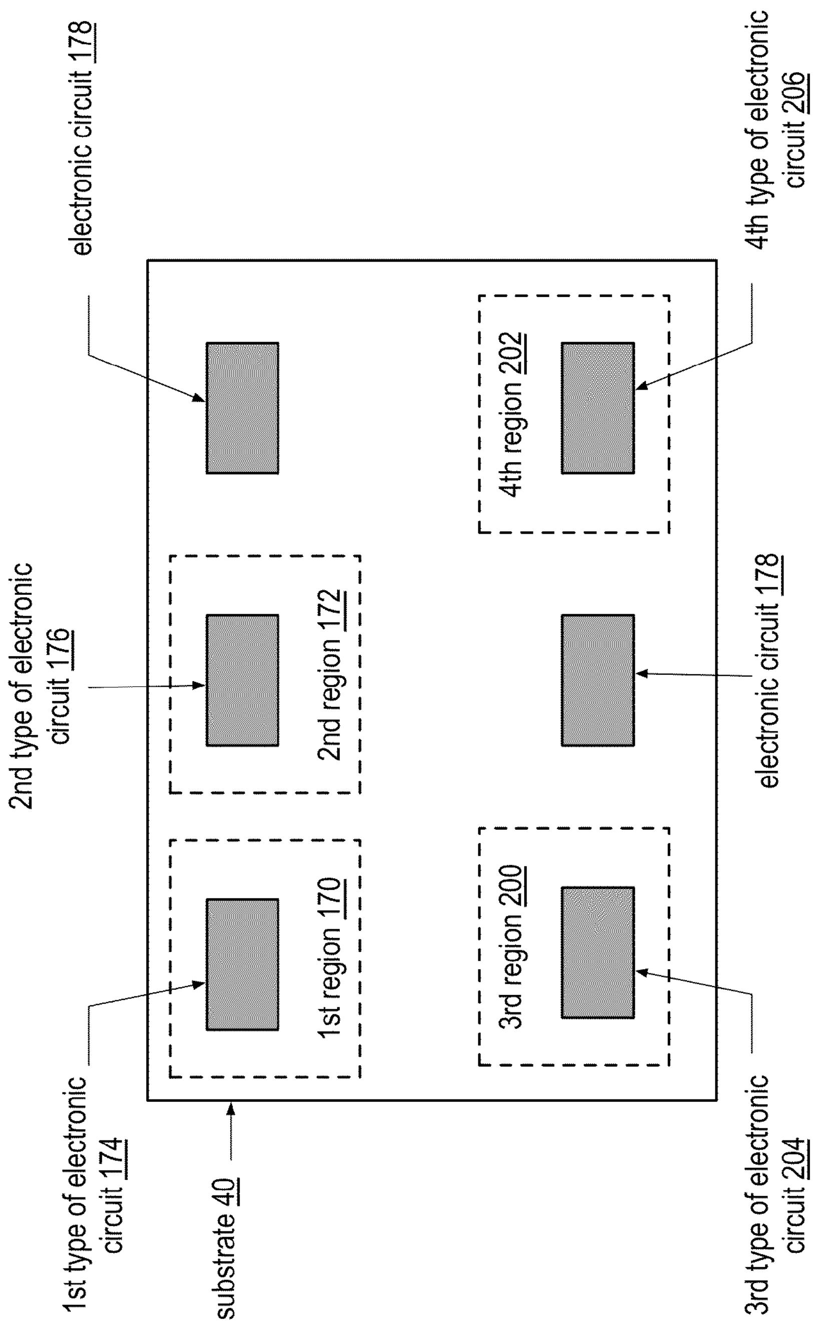
FIG. 28 is a diagram of another embodiment of substrate supporting a plurality of electronic circuits in accordance with the present invention.

FIG. 28 is a diagram of another embodiment of substrate 40 supporting electronic circuits 174-178. In this embodiment, the substrate 40 includes a plurality of regions 170, 172, 200, and 202. The first region 170 supports one or more first type of electronic circuits 174; the second region 172 supports one or more second type of electronic circuits 176; the third region 200 supports one or more third type of electronic circuits 204; and the fourth region 202 supports one or more fourth type of electronic circuits 206. Note that the third region 200 has third permittivity, permeability, and conductivity characteristics and the fourth region 202 has fourth permittivity, permeability, and conductivity characteristics.

Figure 29:
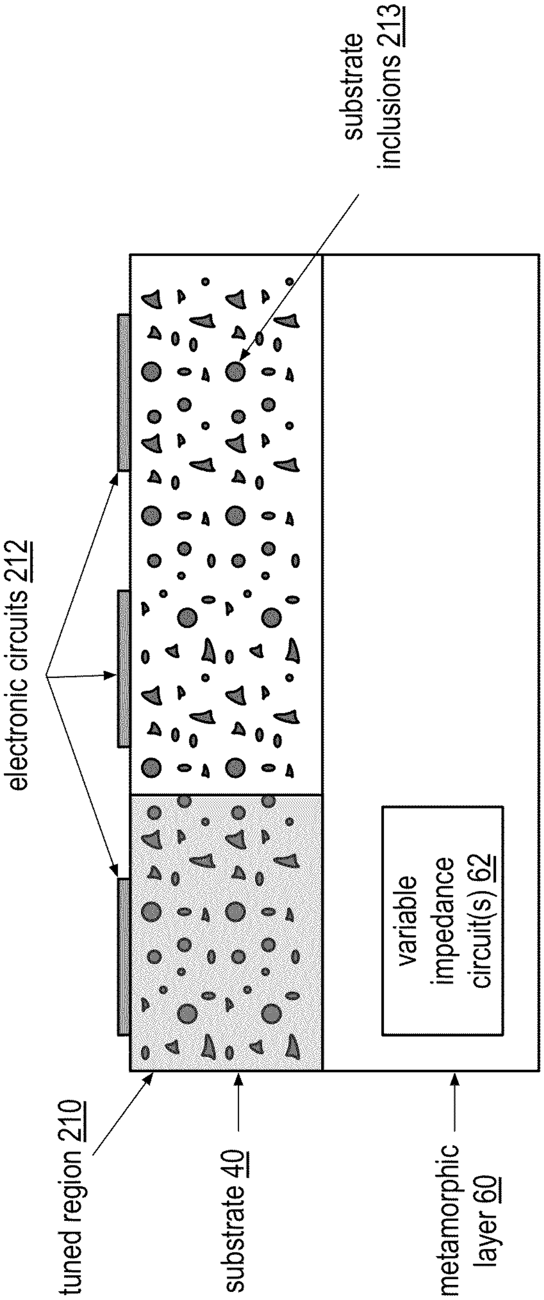
FIG. 29 is a diagram of another embodiment of substrate supporting a plurality of electronic circuits in accordance with the present invention.

FIG. 29 is a diagram of another embodiment of a programmable substrate including one or more substrates 40 and one or more metamorphic layers 60. The programmable substrate supports electronic circuits 212 (e.g., a capacitor, a resistor, an inductor, a transistor, a diode, an antenna, and/or combinations thereof). The substrate 40 includes embedded substrate includes 213 (e.g., non-magnetic metallodielectric inclusions, high permittivity metallodielectric inclusions, metallic inclusions, air pockets, dielectric inclusions, discrete RLC on-die components, and a printed metallization within one or more layers of the substrate) to provide base permittivity, permeability, and conductivity characteristics. The metamorphic layer 60 includes one or more variable circuits 62, which tunes the permittivity, permeability, and conductivity characteristics of a region 210 of the substrate 40.

As an example, the substrate may be a porous alumina with implanted and randomly distributed air pockets, or other material, (e.g., substrate inclusions), which can be hexagonal in shape, cylindrical in shape, spherical in shape, and/or having other shapes. The dimensions of the substrate inclusions are controllable through the fabrication process. The electromagnetic (EM) properties of the substrate depend on the EM properties of the base material, as well as the shape, size, and spacing of the substrate inclusions. The substrate inclusions can be designed in an ordered or randomly distributed array. Their shape, size and inter spacing control the bandwidth over which the desired material properties are needed. Such properties can be varied by further inclusion of variable impedance circuits in one or more metamorphic layers.

As may be used herein, a substrate is considered programmable, or tuned, if (a) during the fabrication of a substrate, it is fabricated with regions that have ordered substrate inclusions and/or regions with disordered or randomly distributed substrate inclusions; (b) during the fabrication of the substrate, it is fabricated with regions that have different lateral sizes and dimensions and therefore different EM properties; (c) an algorithm is used to control the design of programmable substrates; (d) a substrate has substrate inclusions of biased ferroelectric materials for variable substrate EM properties (permittivity and/or permeability); and/or (e) a substrate that includes MEMS switches to achieve locally variable substrate EM properties.

A programmable, or tuned, substrate may used to support and tune one or more of an inductor, a transformer, an amplifier, a power driver, a filter, an antenna, an antenna array, a CMOS device, a GaAS device, transmission lines, vias, capacitors, a radio transceiver, a radio receiver, a radio transmitter, etc.

Figure 30:
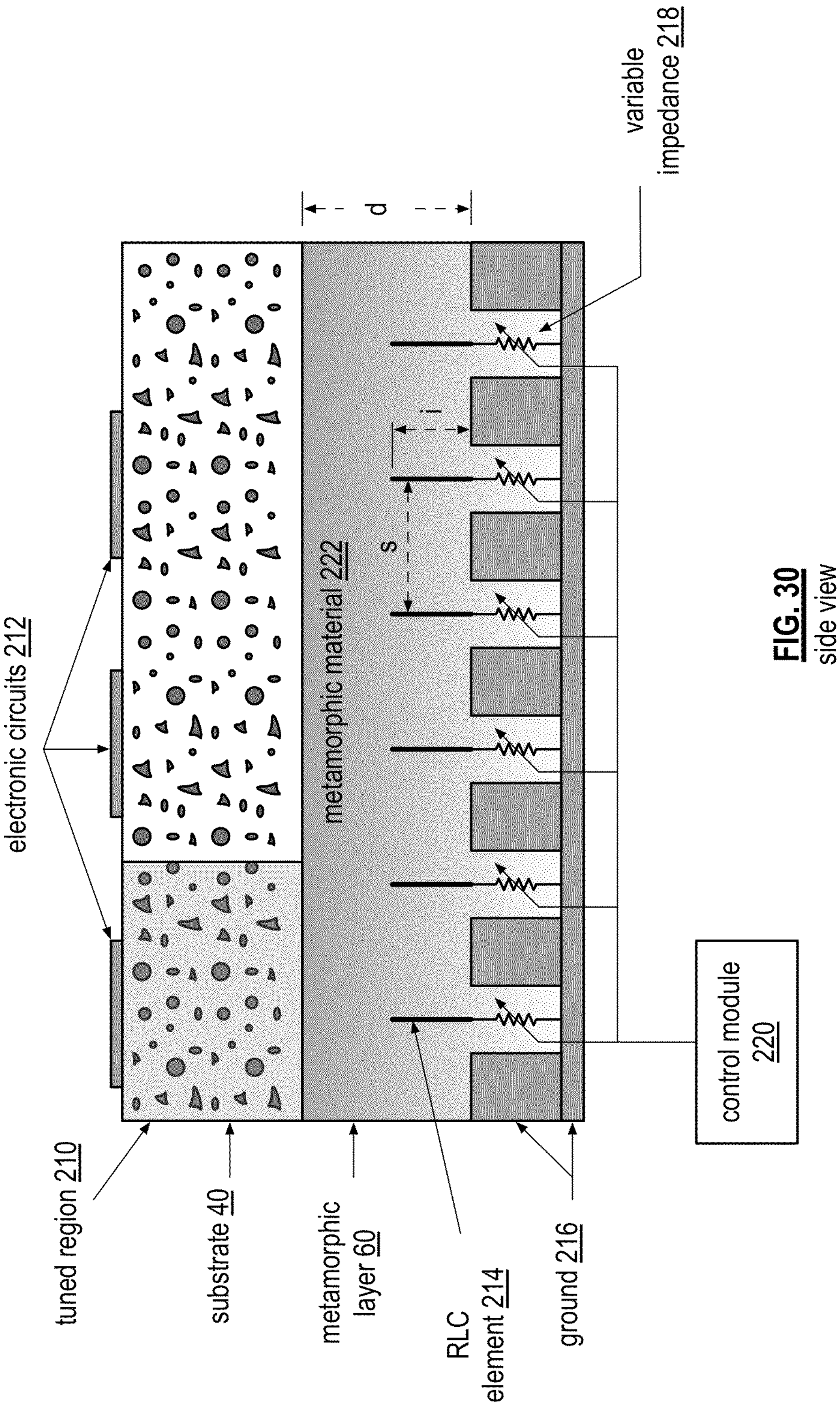
FIG. 30 is a diagram of an embodiment of a programmable substrate supporting a plurality of electronic circuits in accordance with the present invention.

FIG. 30 is a diagram of another embodiment of a programmable substrate including one or more substrates 40, which supports electronic circuits 212, one or more metamorphic layers 60, and a control module 220. The substrate 40 includes embedded substrate includes 213 to provide base permittivity, permeability, and conductivity characteristics. The metamorphic layer 60 includes a ground 216 with openings and, within an opening, one or more variable circuits 62 that includes an RLC element 214 (e.g., a wire, a trace, a metallic plane, a planar coil, a helical coil, etc.) and a variable impedance 218.

The control module 220 provides control signals to the one or more variable impedance circuits to tune the base permittivity, permeability, and conductivity characteristics thereby providing the desired permittivity, permeability, and conductivity characteristics. Note that the spacing (S) between the circuits 62, the length (l) of the RLC elements 214, and the distance (d) from the ground to the substrate 40 affect the electromagnetic properties of the programmable substrate. Further note that one end of the RLC elements 214 is open.

Figure 31:
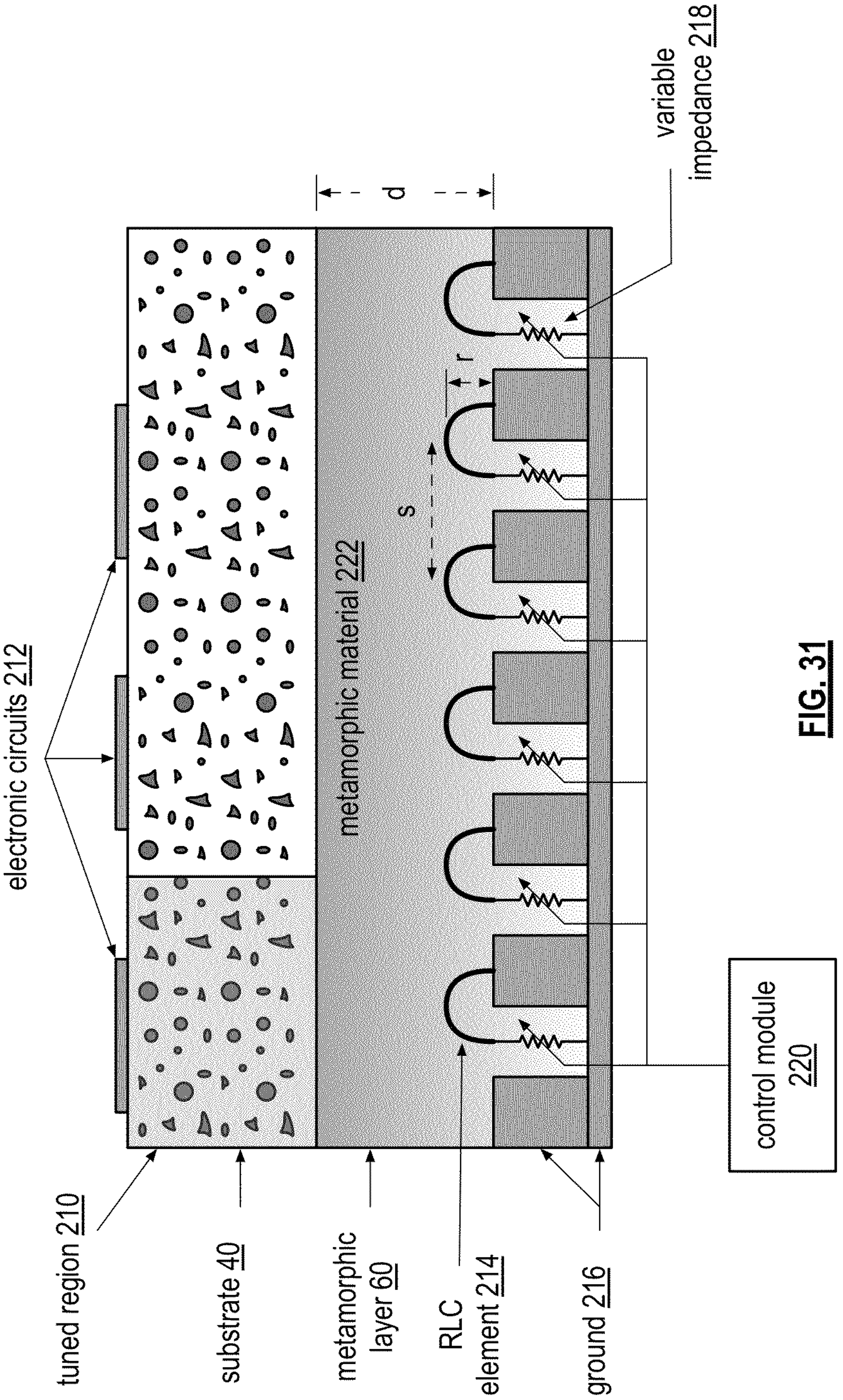
FIG. 31 is a diagram of another embodiment of a programmable substrate supporting a plurality of electronic circuits in accordance with the present invention.

FIG. 31 is a diagram of another embodiment of a programmable substrate including one or more substrates 40, which supports electronic circuits 212, one or more metamorphic layers 60, and a control module 220. The substrate 40 includes embedded substrate includes 213 to provide base permittivity, permeability, and conductivity characteristics. The metamorphic layer 60 includes a ground 216 with openings and, within an opening, one or more variable circuits 62 that includes an RLC element 214 (e.g., a wire, a trace, a metallic plane, a planar coil, a helical coil, etc.) and a variable impedance 218. Note that one end of the RLC element 214 is coupled to ground and the other is coupled to a corresponding variable impedance 218.

Figure 32:
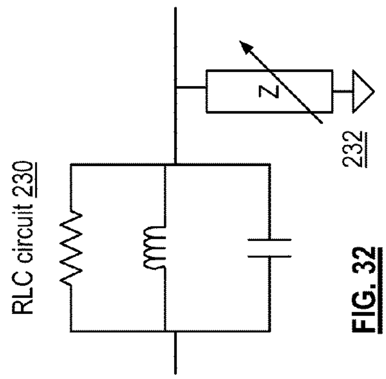
FIG. 32 is a diagram of an embodiment of an AMM cell, of a metallodielectric cell, or of a variable impedance circuit in accordance with the present invention.

FIG. 32 is a circuit schematic block diagram of an embodiment of an AMM cell, of a metallodielectric cell, or of a variable impedance circuit where a conductive element is represented as a lumped RLC circuit 230. In this example, the impedance element 232 is a variable impedance circuit that is coupled in series with the RLC circuit 232. Note that in an alternate embodiment, the impedance element 232 may be a fixed impedance circuit.

Figure 33:
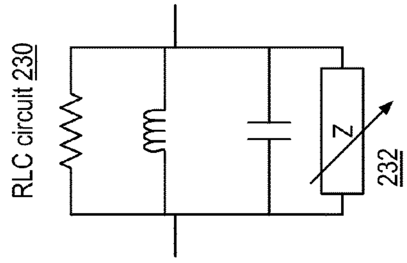
FIG. 33 is a diagram of another embodiment of an AMM cell, of a metallodielectric cell, or of a variable impedance circuit in accordance with the present invention.

FIG. 33 is a circuit schematic block diagram of an embodiment of an AMM cell, of a metallodielectric cell, or of a variable impedance circuit where the conductive element is represented as a lumped RLC circuit 230. In this example, the impedance element 232 is a variable impedance circuit that is coupled in parallel with the RLC circuit 230. Note that in an alternate, the impedance element 230 may be a fixed impedance circuit.

Figure 34:
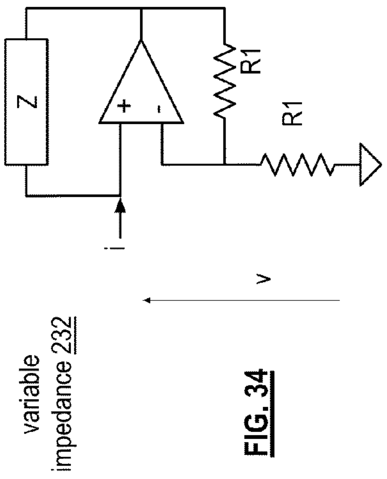
FIG. 34 is a diagram of an embodiment of a variable impedance of an AMM cell, of a metallodielectric cell, or of a variable impedance circuit in accordance with the present invention.

FIG. 34 is a circuit schematic block diagram of an embodiment of a variable impedance element 232 of an AMM cell, of a metallodielectric cell, or of a variable impedance circuit implemented as a negative resistor. The negative resistor includes an operational amplifier, a pair of resistors, and a passive component impedance circuit (Z), which may include a resistor, a capacitor, and/or an inductor.

Figure 35:
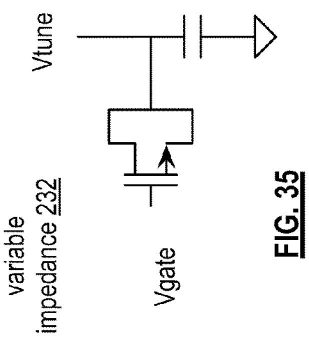
FIG. 35 is a diagram of another embodiment of a variable impedance of an AMM cell, of a metallodielectric cell, or of a variable impedance circuit in accordance with the present invention.

FIG. 35 is a circuit schematic block diagram of another embodiment of a variable impedance element 232 of an AMM cell, of a metallodielectric cell, or of a variable impedance circuit implemented as a varactor. The varactor includes a transistor and a capacitor. The gate of the transistor is driven by a gate voltage (Vgate) and the connection of the transistor and capacitor is driven by a tuning voltage (Vtune). As an alternative embodiment of the variable impedance element 232, it may implemented using passive components (e.g., resistors, capacitors, and/or inductors), where at least of the passive components is adjustable.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. An integrated circuit die comprises:

a semiconductor substrate; and a plurality of electronic circuits on the semiconductor substrate, wherein the semiconductor substrate is divided into a plurality of regions, wherein a first region of the plurality of regions supports a first type of electronic circuit and the semiconductor substrate has first permittivity, permeability, and conductivity characteristics within the first region and wherein a second region of the plurality of regions supports a second type of electronic circuit and the semiconductor substrate has second permittivity, permeability, and conductivity characteristics within the second region, wherein the semiconductor substrate in the first region includes a substrate material that has a perforated silicon pattern such that first region has a high effective permittivity.

2. The integrated circuit die of claim 1, wherein the semiconductor substrate comprises at least one of:

silicon germanium;

porous alumina;

silicon monocrystals; and gallium arsenide.

3. The integrated circuit die of claim 1 further comprises:

the semiconductor substrate in the first region including a substrate material that has embedded therein a first embedding pattern of at least one of metallic inclusions and dielectric elements to produce the first permittivity, permeability, and conductivity characteristics; and the semiconductor substrate in the second region including the substrate material that has embedded therein a second embedding pattern of the at least one of metallic inclusions and dielectric elements to produce the second permittivity, permeability, and conductivity characteristics.

4. The integrated circuit die of claim 3 further comprises:

the first embedding pattern indicating a first quantity of the at least one of metallic inclusions and dielectric elements, a first spacing for the at least one of metallic inclusions and dielectric elements, and a first variety of sizes for the at least one of metallic inclusions and dielectric elements; and the second embedding pattern indicating a second quantity of the at least one of metallic inclusions and dielectric elements, a second spacing for the at least one of metallic inclusions and dielectric elements, and a second variety of sizes for the at least one of metallic inclusions and dielectric elements.

5. The integrated circuit die of claim 1 further comprises:

the semiconductor substrate in the first region including a substrate material that has embedded therein metallodielectric structures such that the first region has a high effective permeability.

6. The integrated circuit die of claim 1, wherein an electronic circuit of the plurality of electronic components comprises at least one of:

a capacitor;

a resistor;

an inductor;

a transistor;

a diode; and an antenna.

7. A semiconductor substrate comprises:

a plurality of regions, wherein a first region of the plurality of regions has first permittivity, permeability, and conductivity characteristics and wherein a second region of the plurality of regions has second permittivity, permeability, and conductivity characteristics, wherein in the first region, a substrate material that has a perforated silicon pattern such that first region has a high effective permittivity.

8. The semiconductor substrate of claim 7 comprises a material of at least one of:

silicon germanium;

porous alumina;

silicon monocrystals; and gallium arsenide.

9. The semiconductor substrate of claim 7 further comprises:

in the first region, a substrate material that has embedded therein a first embedding pattern of at least one of metallic inclusions and dielectric elements to produce the first permittivity, permeability, and conductivity characteristics; and in the second region, the substrate material that has embedded therein a second embedding pattern of the at least one of metallic inclusions and dielectric elements to produce the second permittivity, permeability, and conductivity characteristics.

10. The semiconductor substrate of claim 9 further comprises:

the first embedding pattern indicating a first quantity of the at least one of metallic inclusions and dielectric elements, a first spacing for the at least one of metallic inclusions and dielectric elements, and a first variety of sizes for the at least one of metallic inclusions and dielectric elements; and the second embedding pattern indicating a second quantity of the at least one of metallic inclusions and dielectric elements, a second spacing for the at least one of metallic inclusions and dielectric elements, and a second variety of sizes for the at least one of metallic inclusions and dielectric elements.

11. The semiconductor substrate of claim 7 further comprises:

in the first region, a substrate material that has embedded therein metallodielectric structures such that the first region has a high effective permeability.

12. The semiconductor substrate of claim 7 further comprises:

a third region of the plurality of regions having third permittivity, permeability, and conductivity characteristics.

13. The semiconductor substrate of claim 7 further comprising a plurality of electronic components including at least one of:

a capacitor;

a resistor;

an inductor;

a transistor;

a diode; and an antenna.

14. A semiconductor substrate comprises:

a plurality of regions, wherein:

a first region of the plurality of regions has first permittivity, permeability, and conductivity characteristics, formed of a substrate material that has embedded therein a first embedding pattern of at least one of metallic inclusions and dielectric elements to produce the first permittivity, permeability, and conductivity characteristics, the first embedding pattern indicating a first quantity of the at least one of metallic inclusions and dielectric elements, a first spacing for the at least one of metallic inclusions and dielectric elements, and a first variety of sizes for the at least one of metallic inclusions and dielectric elements; and a second region of the plurality of regions has second permittivity, permeability, and conductivity characteristics, formed of a substrate material that has embedded therein a second embedding pattern of the at least one of metallic inclusions and dielectric elements to produce the second permittivity, permeability, and conductivity characteristics, the second embedding pattern indicating a second quantity of the at least one of metallic inclusions and dielectric elements, a second spacing for the at least one of metallic inclusions and dielectric elements, and a second variety of sizes for the at least one of metallic inclusions and dielectric elements.

15. The semiconductor substrate of claim 14 comprises a material of at least one of:

silicon germanium;
porous alumina;
silicon monocrystals; and
gallium arsenide.

16. The semiconductor substrate of claim 14 further comprises:

in the first region, a substrate material that has embedded therein metallodielectric structures such that the first region has a high effective permeability.

17. The semiconductor substrate of claim 14 further comprises:

in the first region, a substrate material that has a perforated silicon pattern such that first region has a high effective permittivity.

18. The semiconductor substrate of claim 14 further comprises:

a third region of the plurality of regions having third permittivity, permeability, and conductivity characteristics.

19. The semiconductor substrate of claim 14 further comprising a plurality of electronic components formed in the first region and the second region.

20. The semiconductor substrate of claim 19, wherein the plurality of electronic components comprises at least one of:

a capacitor;
a resistor;
an inductor;
a transistor;
a diode; and
an antenna.

* * * * *